United States Patent
Mathaikutty et al.

(10) Patent No.: US 12,229,673 B2
(45) Date of Patent: Feb. 18, 2025

(54) SPARSITY-AWARE DATASTORE FOR INFERENCE PROCESSING IN DEEP NEURAL NETWORK ARCHITECTURES

(71) Applicant: Intel Corporation, Santa Clara, CA (US)

(72) Inventors: Deepak Mathaikutty, Chandler, AZ (US); Arnab Raha, Santa Clara, CA (US); Raymond Sung, San Francisco, CA (US); Debabrata Mohapatra, Santa Clara, CA (US); Cormac Brick, San Francisco, CA (US)

(73) Assignee: Intel Corporation, Santa Clara, CA (US)

(*) Notice: Subject to any disclaimer, the term of this patent is extended or adjusted under 35 U.S.C. 154(b) by 750 days.

(21) Appl. No.: 17/524,333

(22) Filed: Nov. 11, 2021

(65) Prior Publication Data

US 2022/0067524 A1    Mar. 3, 2022

(51) Int. Cl.
H03M 7/00       (2006.01)
G06N 3/08       (2023.01)
G06N 5/04       (2023.01)
H03M 7/30       (2006.01)

(52) U.S. Cl.
CPC ............... *G06N 3/08* (2013.01); *G06N 5/04* (2013.01); *H03M 7/6005* (2013.01)

(58) Field of Classification Search
CPC .......... G06N 3/08; G06N 5/04; H03M 7/6005
USPC ................................. 341/50, 51, 59
See application file for complete search history.

(56) References Cited

U.S. PATENT DOCUMENTS

2018/0024746 A1*   1/2018   Jagadeesh ............... G06F 3/064
                                                        711/154
2020/0228137 A1    7/2020   Chinya et al.

* cited by examiner

*Primary Examiner* — Peguy Jean Pierre
(74) *Attorney, Agent, or Firm* — Jordan IP Law, LLC

(57) ABSTRACT

Systems, apparatuses and methods may provide for technology that prefetches compressed data and a sparsity bitmap from a memory to store the compressed data in a decode buffer, where the compressed data is associated with a plurality of tensors, wherein the compressed data is in a compressed format. The technology aligns the compressed data with the sparsity bitmap to generate decoded data, and provides the decoded data to a plurality of processing elements.

25 Claims, 16 Drawing Sheets

FIG. 3

| Datastore Entry | (X,Y) Coordinate | Datastore Entry | (X,Y) Coordinate | Datastore Entry | (X,Y) Coordinate |
|---|---|---|---|---|---|
| DS 0 | (0,0) | DS 0 | (0,0) | DS 0 | (0,0) |
| DS 1 | (0,1) | DS 1 | (0,1) | DS 1 | (0,1) |
| DS 2 | (0,2) | DS 2 | (1,0) | DS 2 | (0,2) |
| DS 3 | (0,3) | DS 3 | (1,1) | DS 3 | (0,3) |
| DS 4 | (1,0) | DS 4 | (2,0) | DS 4 | (0,4) |
| DS 5 | (1,1) | DS 5 | (2,1) | DS 5 | (0,5) |
| DS 6 | (1,2) | DS 6 | (3,0) | DS 6 | (0,6) |
| DS 7 | (1,3) | DS 7 | (3,1) | DS 7 | (0,7) |
| DS 8 | (2,0) | DS 8 | (4,0) | DS 8 | (1,0) |
| DS 9 | (2,1) | DS 9 | (4,1) | DS 9 | (1,1) |
| DS 10 | (2,2) | DS 10 | (5,0) | DS 10 | (1,2) |
| DS 11 | (2,3) | DS 11 | (5,1) | DS 11 | (1,3) |
| DS 12 | (3,0) | DS 12 | (6,0) | DS 12 | (1,4) |
| DS 13 | (3,1) | DS 13 | (6,1) | DS 13 | (1,5) |
| DS 14 | (3,2) | DS 14 | (7,2) | DS 14 | (1,6) |
| DS 15 | (3,3) | DS 15 | (7,3) | DS 15 | (1,7) |
| Schedule 1 Inner Loop — 502 | | Schedule 2 Inner Loop — 504 | | Schedule 3 Inner Loop — 506 | |

Tile Walkers - 8x1x64 (Inner Loop)

| | FX=0 FY=0 | FX=0 FY=1 | FX=1 FY=0 | FX=2 FY=0 | FX=0 FY=1 |
|---|---|---|---|---|---|
| Tile Walker 0 | (0,0,32) | (0,0,64) | (1,0,32) | (2,0,32) | (0,1,32) |
| Tile Walker 1 | (1,0,32) | (1,0,64) | (2,0,32) | (3,0,32) | (1,1,32) |
| Tile Walker 2 | (2,0,32) | (2,0,64) | (3,0,32) | (4,0,32) | (2,1,32) |
| Tile Walker 3 | (3,0,32) | (3,0,64) | (4,0,32) | (5,0,32) | (3,1,32) |
| Tile Walker 4 | (4,0,32) | (4,0,64) | (5,0,32) | (6,0,32) | (4,1,32) |
| Tile Walker 5 | (5,0,32) | (5,0,64) | (6,0,32) | (7,0,32) | (5,1,32) |
| Tile Walker 6 | (6,0,32) | (6,0,64) | (7,0,32) | | (6,1,32) |
| Tile Walker 7 | (7,0,32) | (7,0,64) | | | (7,1,32) |

| | FX=1 FY=1 | FX=2 FY=1 | FX=0 FY=2 | FX=1 FY=2 | FX=2 FY=2 |
|---|---|---|---|---|---|
| Tile Walker 0 | (1,1,32) | (2,1,32) | (0,2,32) | (1,2,64) | (2,2,64) |
| Tile Walker 1 | (2,1,32) | (3,1,32) | (1,2,32) | (2,2,64) | (3,2,64) |
| Tile Walker 2 | (3,1,32) | (4,1,32) | (2,2,32) | (3,2,64) | (4,2,64) |
| Tile Walker 3 | (4,1,32) | (5,1,32) | (3,2,32) | (4,2,64) | (5,2,64) |
| Tile Walker 4 | (5,1,32) | (6,1,32) | (4,2,32) | (5,2,64) | (6,2,64) |
| Tile Walker 5 | (6,1,32) | (7,1,32) | (5,2,32) | (6,2,64) | (7,2,64) |
| Tile Walker 6 | (7,1,32) | | (6,2,32) | (7,2,64) | |
| Tile Walker 7 | | | (7,2,32) | | |

FIG. 7C

| Datastore Bank 0 | (X,Y) coordinate | Datastore Bank 1 | (X,Y) coordinate | Datastore Bank 2 | (X,Y) coordinate | Datastore Bank 3 | (X,Y) coordinate |
|---|---|---|---|---|---|---|---|
| Entry 0  | (0,0) | Entry 0  | (1,0) | Entry 0  | (2,0) | Entry 0  | (3,0) |
| Entry 1  | (0,1) | Entry 1  | (1,1) | Entry 1  | (2,1) | Entry 1  | (3,1) |
| Entry 2  | (0,2) | Entry 2  | (1,2) | Entry 2  | (2,2) | Entry 2  | (3,2) |
| Entry 3  | (0,3) | Entry 3  | (1,3) | Entry 3  | (2,3) | Entry 3  | (3,3) |
| Entry 4  | (0,4) | Entry 4  | (1,4) | Entry 4  | (2,4) | Entry 4  | (3,4) |
| Entry 5  | (0,5) | Entry 5  | (1,5) | Entry 5  | (2,5) | Entry 5  | (3,5) |
| Entry 6  | (0,6) | Entry 6  | (1,6) | Entry 6  | (2,6) | Entry 6  | (3,6) |
| Entry 7  | (0,7) | Entry 7  | (1,7) | Entry 7  | (2,7) | Entry 7  | (3,7) |
| Entry 8  | (4,0) | Entry 8  | (5,0) | Entry 8  | (6,0) | Entry 8  | (7,0) |
| Entry 9  | (4,1) | Entry 9  | (5,1) | Entry 9  | (6,1) | Entry 9  | (7,1) |
| Entry 10 | (4,2) | Entry 10 | (5,2) | Entry 10 | (6,2) | Entry 10 | (7,2) |
| Entry 11 | (4,3) | Entry 11 | (5,3) | Entry 11 | (6,3) | Entry 11 | (7,3) |
| Entry 12 | (4,4) | Entry 12 | (5,4) | Entry 12 | (6,4) | Entry 12 | (7,4) |
| Entry 13 | (4,5) | Entry 13 | (5,5) | Entry 13 | (6,5) | Entry 13 | (7,5) |
| Entry 14 | (4,6) | Entry 14 | (5,6) | Entry 14 | (6,6) | Entry 14 | (7,6) |
| Entry 15 | (4,7) | Entry 15 | (5,7) | Entry 15 | (6,7) | Entry 15 | (7,7) |

| 542 | FX=0 FY=0 | FX=1 FY=0 | FX=2 FY=0 | FX=0 FY=1 | FX=1 FY=1 |
|---|---|---|---|---|---|
| Tile Walker 0 | (0,0,32) (0,0,64) | (1,0,32) (1,0,64) | (2,0,32) (2,0,64) | (0,1,32) (0,1,64) | (1,1,32) (1,1,64) |
| Tile Walker 1 | (1,0,32) (1,0,64) | (2,0,32) (2,0,64) | (3,0,32) (3,0,64) | (1,1,32) (1,1,64) | (2,1,32) (2,1,64) |
| Tile Walker 2 | (2,0,32) (2,0,64) | (3,0,32) (3,0,64) | (4,0,32) (4,0,64) | (2,1,32) (2,1,64) | (3,1,32) (3,1,64) |
| Tile Walker 3 | (3,0,32) (3,0,64) | (4,0,32) (4,0,64) | (5,0,32) (5,0,64) | (3,1,32) (3,1,64) | (4,1,32) (4,1,64) |
| Tile Walker 4 | (4,0,32) (4,0,64) | (5,0,32) (5,0,64) | (6,0,32) (6,0,64) | (4,1,32) (4,1,64) | (5,1,32) (5,1,64) |
| Tile Walker 5 | (5,0,32) (5,0,64) | (6,0,32) (6,0,64) | (7,0,32) (7,0,64) | (5,1,32) (5,1,64) | (6,1,32) (6,1,64) |
| Tile Walker 6 | (6,0,32) (6,0,64) | (7,0,32) (7,0,64) | | (6,1,32) (6,1,64) | (7,1,32) (7,1,64) |
| Tile Walker 7 | (7,0,32) (7,0,64) | | | (7,1,32) (7,1,64) | |

| | FX=2 FY=1 | FX=0 FY=2 | FX=1 FY=2 | FX=2 FY=2 |
|---|---|---|---|---|
| Tile Walker 0 | (2,1,32) (2,1,64) | (0,2,32) (0,2,64) | (1,2,32) (1,2,64) | (2,2,32) (2,2,64) |
| Tile Walker 1 | (3,1,32) (3,1,64) | (1,2,32) (1,2,64) | (2,2,32) (2,2,64) | (3,2,32) (3,2,64) |
| Tile Walker 2 | (4,1,32) (4,1,64) | (2,2,32) (2,2,64) | (3,2,32) (3,2,64) | (4,2,32) (4,2,64) |
| Tile Walker 3 | (5,1,32) (5,1,64) | (3,2,32) (3,2,64) | (4,2,32) (4,2,64) | (5,2,32) (5,2,64) |
| Tile Walker 4 | (6,1,32) (6,1,64) | (4,2,32) (4,2,64) | (5,2,32) (5,2,64) | (6,2,32) (6,2,64) |
| Tile Walker 5 | (7,1,32) (7,1,64) | (5,2,32) (5,2,64) | (6,2,32) (6,2,64) | (7,2,32) (7,2,64) |
| Tile Walker 6 | | (6,2,32) (6,2,64) | (7,2,32) (7,2,64) | |
| Tile Walker 7 | | (7,2,32) (7,2,64) | | |

FIG. 10

SPARSITY-AWARE DATASTORE FOR INFERENCE PROCESSING IN DEEP NEURAL NETWORK ARCHITECTURES

TECHNICAL FIELD

Embodiments generally relate to a sparsity-aware datastore capable of aligning a sparsity bitmap and sparse compressed data for efficient data movement into a PE array that includes processing elements (PEs). More particularly, the sparsity-aware datastore increases reuse of compressed data across the PE array by performing the sparsity decoding within each individual storage element prior to distribution of the decoded data to the PE array.

BACKGROUND

AI applications have resulted in an explosion of newly developed neural network architectures and hardware systems. The hardware systems execute the neural networks to accelerate solutions to complex real-world problems and empower machines to execute decision making processes as well as actions. Such neural network architectures and hardware systems may require a tremendous amount of energy. For example, data movement and decoding may significantly increase the energy costs resulting in increased costs and heating related performance drawbacks. The amount of activation and weight data distributed through the accelerator for a network layer is driven by a compiler that determines the sequence of data movement for optimal energy.

BRIEF DESCRIPTION OF THE DRAWINGS

The various advantages of the embodiments will become apparent to one skilled in the art by reading the following specification and appended claims, and by referencing the following drawings, in which:

FIG. 3 is a diagram of an example of an activation memory layout according to an embodiment;

FIGS. 7A, 7B and 7C are diagrams of an example of a schedule and datastore mapping for a flat datastore according to an embodiment;

FIG. 9 is a diagram of an example of address mapping according to an embodiment;

FIG. 10 is a diagram of an example of a schedule and datastore mapping for an overlapping banking datastore according to an embodiment;

DESCRIPTION OF EMBODIMENTS

Figure 1:
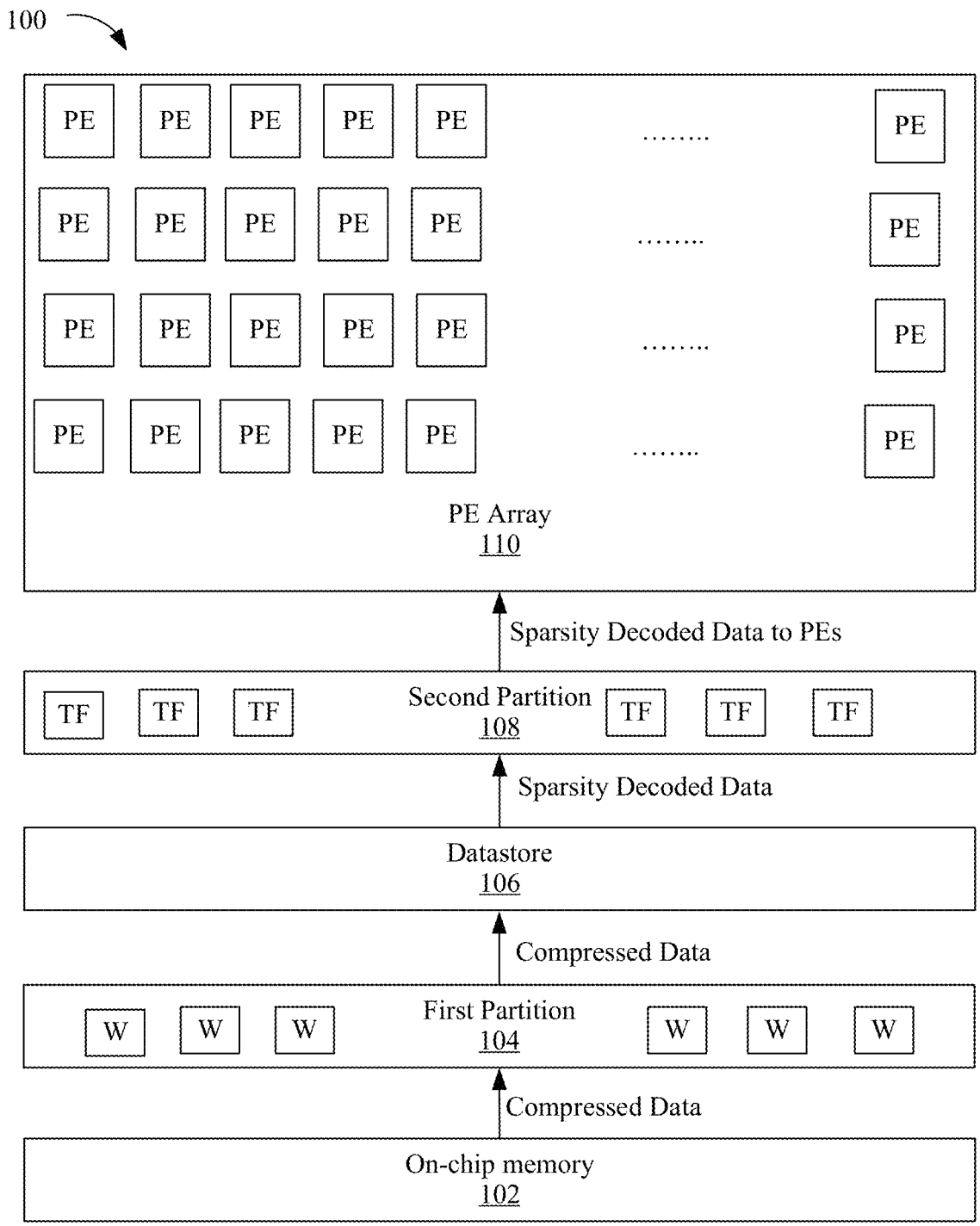
FIG. 1 is a block diagram of an example of enhanced deep neural network architecture according to an embodiment.

FIG. 1 illustrates an enhanced deep neural network (DNN) architecture 100 that includes a data distribution network. To provide flexibility to the data distribution network, an intermediate on-chip buffering comprising first partition 104, datastore 106 and second partition 108 are provided on a load path between on-chip memory 102 and a PE array 110. The on-chip memory 102 may store compressed data (e.g., compressed unaligned data) that is to be utilized by the PE array 110.

The datastore 106 (which may include a plurality of individual units or instances dedicated to different writers or writing portions discussed blow) may be enhanced relative to conventional buffers, to also serve as a decoupling mechanism between the first partition 104 (which may include tile walkers or writing portions referred to as "W") and a second partition 108 (which may include tile feeders referred to as "TF"). Writers of the first partition 104 fetch sparse compressed data and sparsity bitmap (SPMAP) from the on-chip memory 102 (e.g., a Static random-access memory (SRAM)) and populate the datastore 106.

The datastore 106 stores the compressed data and the SPMAP retrieved by the first partition 104 from the on-chip memory 102 in various instances (discussed below). The datastore 106 is also responsible for sparsity decoding, which results in the compressed data and the SPMAP being aligned before loading the SPMAP and the compressed data into the PE array 110. In conventional implementations that do not include such a centralized decoding, the PE array 110 would need to align the compressed data and the SPMAP internally and potentially within each PE of the PE array 110, which would result in duplication of the logic across the entire PE array 110. Doing so results in increased hardware and power costs with reduced efficiency.

For example, where a distribution pattern is a broadcast, the datastore 106 decodes the data and the decoded (e.g., aligned SPMAP and the compressed data) reused from the datastore 106, and the decoded data is fed to all PEs within the PE array 110. Without datastore 106 (e.g., a centralized decoding database), such decoding would need to be done inside all the PEs of the PE array 110 for the same data, which would require adding the decoding logic in all PEs and wasting energy by doing the same decoding everywhere in the PEs. In present embodiments, having executed the decoding prior to the broadcast distribution to the PEs in the PE array 100 and inside the datastore 106 will save energy and reduce the footprint of each of the PEs (e.g., 256 PEs).

Thus, the datastore 106 may align the SPMAP and compressed data to decode the SPMAP and compressed data. Thereafter, the datastore 106 may provide the aligned compressed data (i.e., decoded) and the SPMAP to the second partition 108 as the sparsity decoded data. The second partition 108 may distribute the sparsity decoded data to the PEs of the PE array 110 as shown in FIG. 1. For example, individual tile feeders (TFs) of the second partition 108 may provide the sparsity decoded data to the PEs in a unicast, multicast and/or broadcast manner.

Thus, the data distribution network includes first and second partitions 104, 108 that operate independently from each other. The first partition 104 includes writers to write into the datastore 106 and who are responsible for prefetching the sparse data and SPMAP from on-chip memory 102 and populating the datastore 106. Given the lengthy latencies associated with on-chip memory 102 reads, the writers begin fetching data as soon as a tensor (e.g., activation related data) is available in on-chip memory 102 In some embodiments, the writers of the first partition 104 are programmed to prefetch as much compressed data and SPMAP as a capacity of the datastore 106 permits, so that the data is readily available to the second partition 108. The second partition 108 (i.e., Tile feeders which may be implemented in hardware such as circuit technology, fixed function hardware, configurable hardware, etc.) accesses the pre-fetched data from the datastore 106 that is readily available to distribute the data from the datastore 106 into the PEs at the rate of consumption of the PEs. Thus, the distributed data from the second partition 108 is not blocked due to the read latencies associated with the physical distance that the data needs to travel between the on-chip memory 102 and the PEs due to the prefetching by the writers.

The second partition 108 has a schedule aware nature and therefore has increased flexibility, and further has the capacity to maximize the data reuse from the datastore 106. In conventional implementations in which no datastore 106, first partition 104 and second partition 108 are used, the data distribution into a PE array would be heavily constrained by the variable load latencies from the on-chip memory 102. These latencies can vary from 6 to 20 cycles based on the on-chip memory size, number of on-chip memory banks, number of read and write ports of the on-chip memory and finally the operating frequency.

Thus, embodiments as described herein reduce the overall data movement through efficient data orchestration. The data volume may be stored and circulated in a manner to maximize throughput performance, which is determined by the levels of memory (e.g., Dynamic random-access memory (DRAM)/Static random-access memory (SRAM)/Register Files (RF)), the amount of storage at each level and the physical distance that the data must travel before compute begins. For example, the first partition 104, the datastore 106 and the second partition 108 (e.g., all of which may be intelligent intermediate storage structures that include buffers), may be more performant for data orchestration through sparsity alignment, which maximizes the data reuse across the PE array 110.

Furthermore, enhancements of the datastore 106 results in reduced power consumption (e.g., reduction of 50-75% in power consumption) and the PE array 110. That is, the PE array 110 may be reduced in size (e.g., 43% savings in silicon area, and 10.6% improvement in utilization) since the hardware area allocated to the sparsity decoding logic may not be present in the PE array 110, since the datastore 106 executes centralized decoding. Embodiments herein include a datastore 106 (which may be sparsity aware) employed for storing and processing tensor data and includes a new microarchitecture layout that delivers higher performance and low power inference in deep neural network accelerator architectures.

Thus, embodiments herein include the datastore 106 that is may be used in deep neural network (DNN) accelerators, which aligns the sparsity bitmap and sparse compressed data for efficient data movement into the PEs and enables reuse post sparsity alignment to design an energy optimal inference engine. As such, PEs do not need to execute decoding and alignment and thus remove the need for sparsity alignment hardware within each PE of the PE array 110. Examples herein describe the datastore 106 that is capable of aligning a sparsity bitmap and sparse compressed data for efficient data movement into PEs. An enhanced feature of the datastore 106 is the ability of the datastore 106 to maximize the reuse of compressed data across the PEs the PE array 110 by performing the sparsity decoding within each storage element (e.g., instance) of the datastore 106 prior to the distribution of the decoded data to the PE array 110 (described further below). Doing so reduces, if not altogether removes, additional sparsity hardware from each PE which accounts for more area and power consumption within a PE to have a multiplicative power and area effect across the PE array 110.

Some examples provide an energy efficient and high-performance edge inference DNN accelerator that delivers higher performance for modern AI workloads. For example, some embodiments enable an efficient data distribution network by minimizing data movement and maximizing data reuse through intermediate storage by exploiting sparsity is to enable a state-of-art AI inference accelerator.

In some examples, the architecture 100 may rely in part on a workload schedule to determine how many contexts to activate, which translates into several tile feeders of the second partition 108 and writers of the first partition 104 being activated and programmed by a compiler. For different tensor sizes, software may program sets of registers for each of the tile feeders of the second partition 108 and the writers of the first partition 104 that specify the start X and Y coordinates, dimensions (e.g., X/Y limit, strides, pads, etc.) and finally the on-chip memory 102 addresses to fetch the sparse compressed data and sparsity bitmap and populate the datastore 106. Similarly, the tile feeders of the second partition 108 provide data to the PE array 110 and may be programmed with stationarity and the level of reuse based on the distribution pattern specified by schedule. These fields of the register may be configured by control/status registers (CSRs).

Aspects of the datastore 106 described herein may be applied to activation maps and/or filters (e.g., where the layers have a small set of weights and the scheduler picks weight-based stationarity for data distribution). Thus, the compressed data may include activation maps and/or filters. A filter may be a set of weights. A neural network may apply the filter to an input activation to create an output activation map (e.g., a feature map) that summarizes the presence of detected features in the input activation (an input feature map). Specifically, a memory layout of the sparse data and the flexible reuse-based data distribution network is illustrated below. An enhanced sparsity alignment scheme will also be described.

Thus, the first partition 104 prefetches compressed data and a sparsity bitmap from a memory to store the compressed data in a decode buffer known as the datastore 106, where the compressed data is associated with a plurality of tensors, and where the compressed data is in a compressed format. The datastore 106 aligns the compressed data with a sparsity bitmap to generate decoded data, and the second partition 108 provides the decoded data to a plurality of processing elements. For example, the second partition 108 distributes the decoded data to the processing elements of the PE array 110 based on individual rates of consumption of the processing elements so that the PEs are not blocked. The datastore 106 includes the decode buffer, and the decode buffer includes a plurality of datastores that include a plurality of buffers. The first partition 104 stores the compressed data in the plurality of datastores based on X values and Y values associated with the tensors. The first partition 104 controls a first writing portion of a plurality of writing portions (e.g., writers or W) to write to a first group of datastores of the decode buffer, where a second group of datastores of the decode buffer is inaccessible to the first writing portion, where the plurality of writing portions is implemented at least partly in one or more of configurable or fixed-functionality hardware. In some examples, the first partition 104 also controls a plurality of writing portions, that are implemented at least partly in one or more of configurable or fixed-functionality hardware, to access any of the plurality of buffers to execute write operations based on X and Y values associated with the plurality of tensors. The datastore 106 aligns a first portion of the compressed data with a first portion of the sparsity bitmap, and provides the first portion of the compressed data with the first portion of the sparsity bitmap to the plurality of processing elements to bypass a provision of unaligned portions of the compressed data and the sparsity bitmap to the processing elements.

Figure 2:
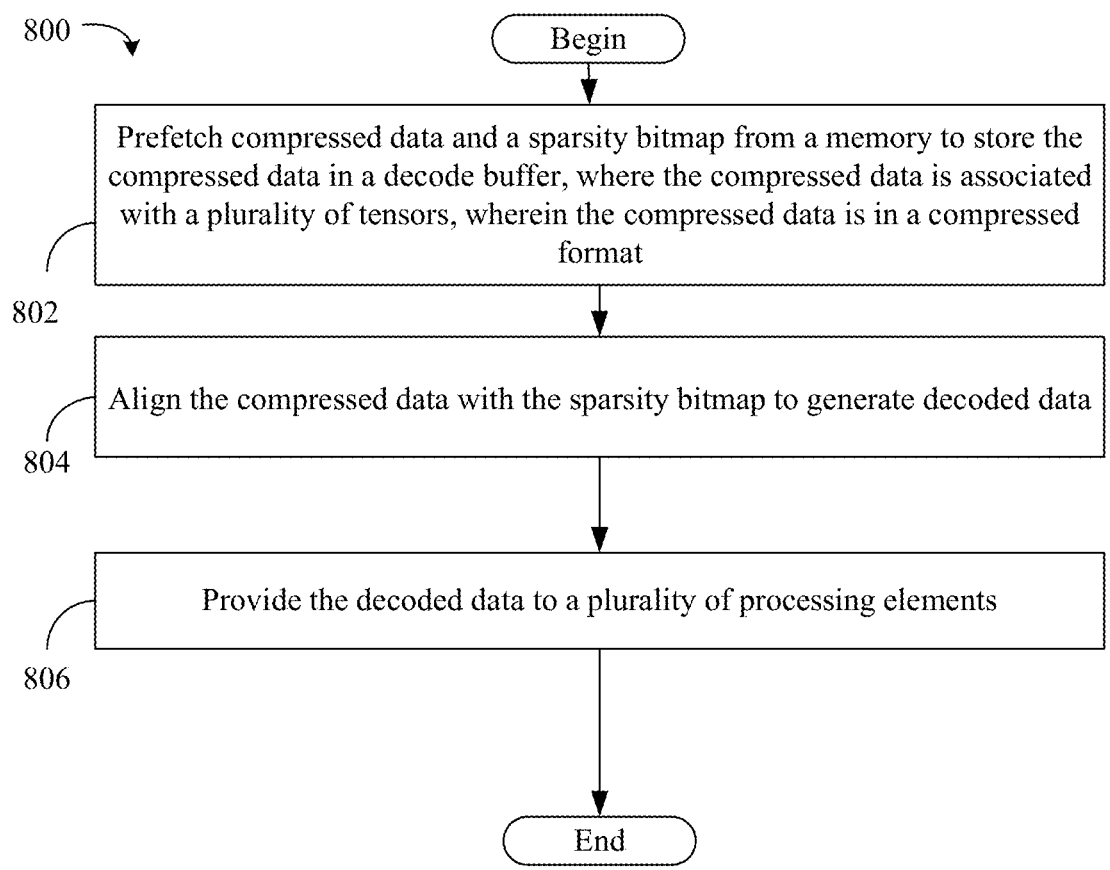
FIG. 2 is a flowchart of an example of a method of decoding data to provide to a PE array according to an embodiment.

FIG. 2 shows a method 800 of decoding data to provide to a PE array. The method 800 may generally be implemented with the embodiments described herein, for example, the enhanced deep neural network (DNN) architecture 100 (FIG. 1) already discussed. In an embodiment, the method 800 is implemented in one or more modules as a set of logic instructions stored in a machine- or computer-readable storage medium such as random access memory (RAM), read only memory (ROM), programmable ROM (PROM), firmware, flash memory, etc., in configurable logic such as, for example, programmable logic arrays (PLAs), field programmable gate arrays (FPGAs), complex programmable logic devices (CPLDs), in fixed-functionality logic hardware using circuit technology such as, for example, application specific integrated circuit (ASIC), complementary metal oxide semiconductor (CMOS) or transistor-transistor logic (TTL) technology, or any combination thereof.

For example, computer program code to carry out operations shown in the method 800 may be written in any combination of one or more programming languages, including an object oriented programming language such as JAVA, SMALLTALK, C++ or the like and conventional procedural programming languages, such as the "C" programming language or similar programming languages. Additionally, logic instructions might include assembler instructions, instruction set architecture (ISA) instructions, machine instructions, machine dependent instructions, microcode, state-setting data, configuration data for integrated circuitry, state information that personalizes electronic circuitry and/or other structural components that are native to hardware (e.g., host processor, central processing unit/CPU, microcontroller, etc.).

Illustrated processing block 802 prefetches compressed data and a sparsity bitmap from a memory to store the compressed data in a decode buffer, where the compressed data is associated with a plurality of tensors, where the compressed data is in a compressed format. Illustrated processing block 804 aligns the compressed data with the sparsity bitmap to generate decoded data. Illustrated processing block 806 provides the decoded data to a plurality of processing elements.

In some examples, the method 800 includes distributing the decoded data to the processing elements based on individual rates of consumption of the processing elements. In some examples, the decode buffer includes a plurality of datastores that include a plurality of buffers, and the method 800 further includes storing the compressed data in the plurality of datastores based on X values and Y values associated with the tensors. In some examples, the method 800 includes controlling a first writing portion of a plurality of writing portions to write to a first group of datastores of the decode buffer, where a second group of datastores of the decode buffer is inaccessible to the first writing portion, and also where the plurality of writing portions is implemented at least partly in one or more of configurable or fixed-functionality hardware. In some examples, the decode buffer includes a plurality of buffers, and the method 800 further comprises controlling a plurality of writing portions (e.g., writers), that are implemented at least partly in one or more of configurable or fixed-functionality hardware, to access any of the plurality of buffers to execute write operations based on X and Y values associated with the plurality of tensors. In some examples, the method 800 includes aligning a first portion of the compressed data with a first portion of the sparsity bitmap, and providing the first portion of the compressed data with the first portion of the sparsity bitmap to the plurality of processing elements to bypass a provision of unaligned portions of the compressed data and the sparsity bitmap to the processing elements.

Figure 3:
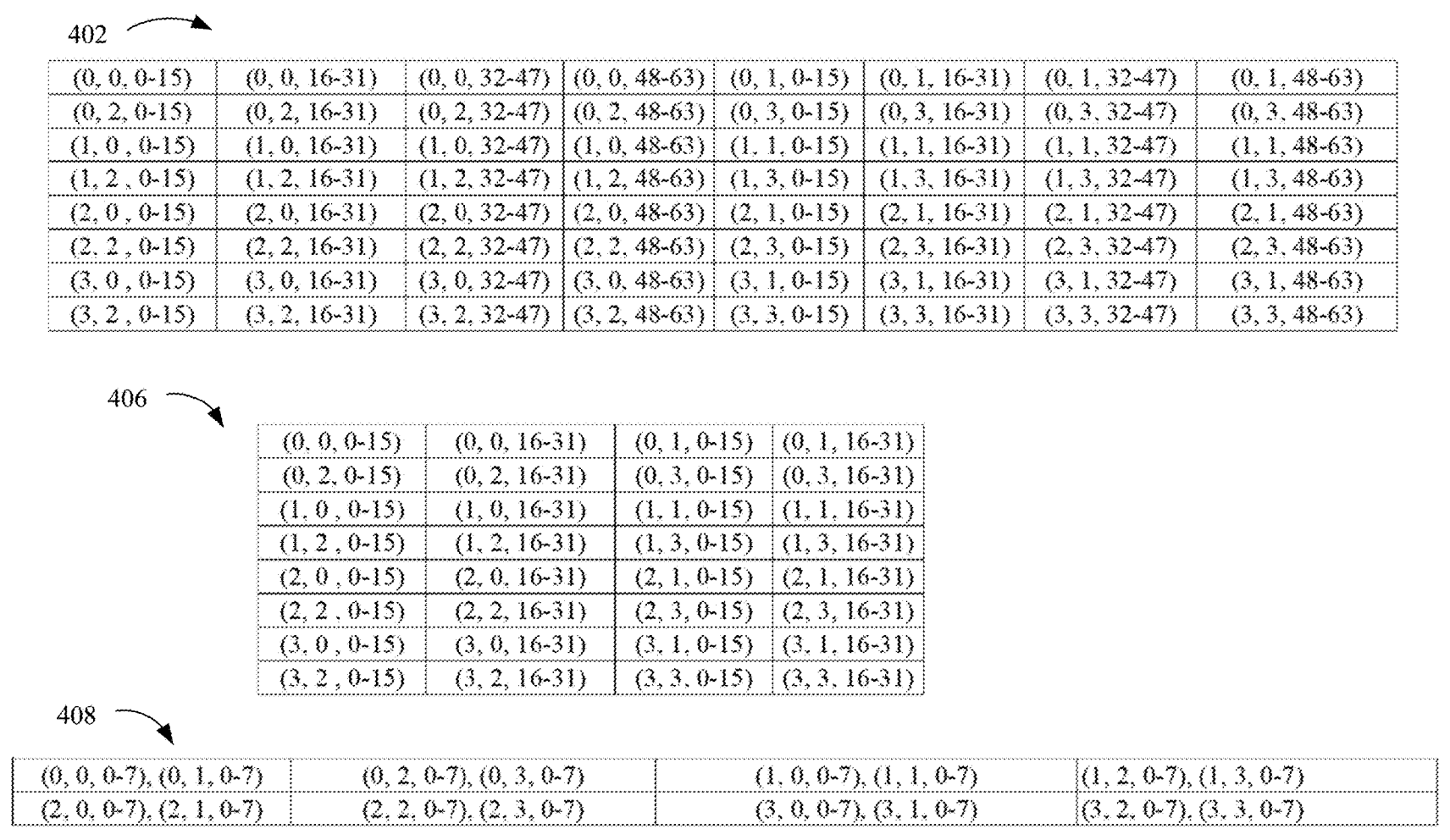

Turning now to FIG. 3, an activation memory layout 402 of a datastore, such as datastore 106 (FIG. 1) is now described. An example of a 4×4×64 tensor is shown in activation memory layout 402. The datastore 106 may be efficiently applied to the activation memory layout 402 of the tensor data. In some cases, the output activations are packed and stored to an on-chip memory, such as on-chip memory 102 (FIG. 1), by a drain or packing block using a Z-major order. An example layout of a 4×4×64 tensor is shown in activation memory layout 402 for a data bank having a size of 16 Bytes, where all the Zs or input channels (IC) (e.g., activation and/or weight data) for a given (X,Y) are stored contiguously. After which, examples layout the ICs for the same X, but increasing Y until the end of the Y dimension is reached. Examples then proceed in the X dimension. Thus, an X value is selected, and the Y and Z values are varied for that X value. Then the X value is incremented, and the Y and Z values are varied for that incremented X value in the activation memory layout 402.

For the activation memory layout 402, the data may be sparse compressed in the same Z-major order and a SPMAP corresponding to the sparse compressed data is also laid out in memory in a similar Z-major order. In zero-value compression (ZVC), examples include 1 bit to denote whether 8 bits of data is non-zero. For example, a sparse compressed data 406 and SPMAP layout 408 in memory is as shown in FIG. 3 for a same 4×4×64 tensor with 50% uniform sparsity. In SPMAP layout 408, the SPMAP for two unique (X,Y) values is stored on the same SRAM line since the SPMAP for each (X,Y) is 8 bytes (64/8).

Due to this fixed layout of the compressed data and SPMAP, conventional implementations may force data distribution from on-chip memory to the PE array to conform to the Z-major order. Such a fixed layout may limit the data load from fully utilizing the bandwidth and maximizing the reuse based on the schedule as the order in which the data is laid out may not always be in the order in which the data needs to be distributed. Thus, some embodiments as described herein may not necessarily conform to the Z major order and may instead distribute data based on other metrics, such as efficiency and performance.

Figure 4:
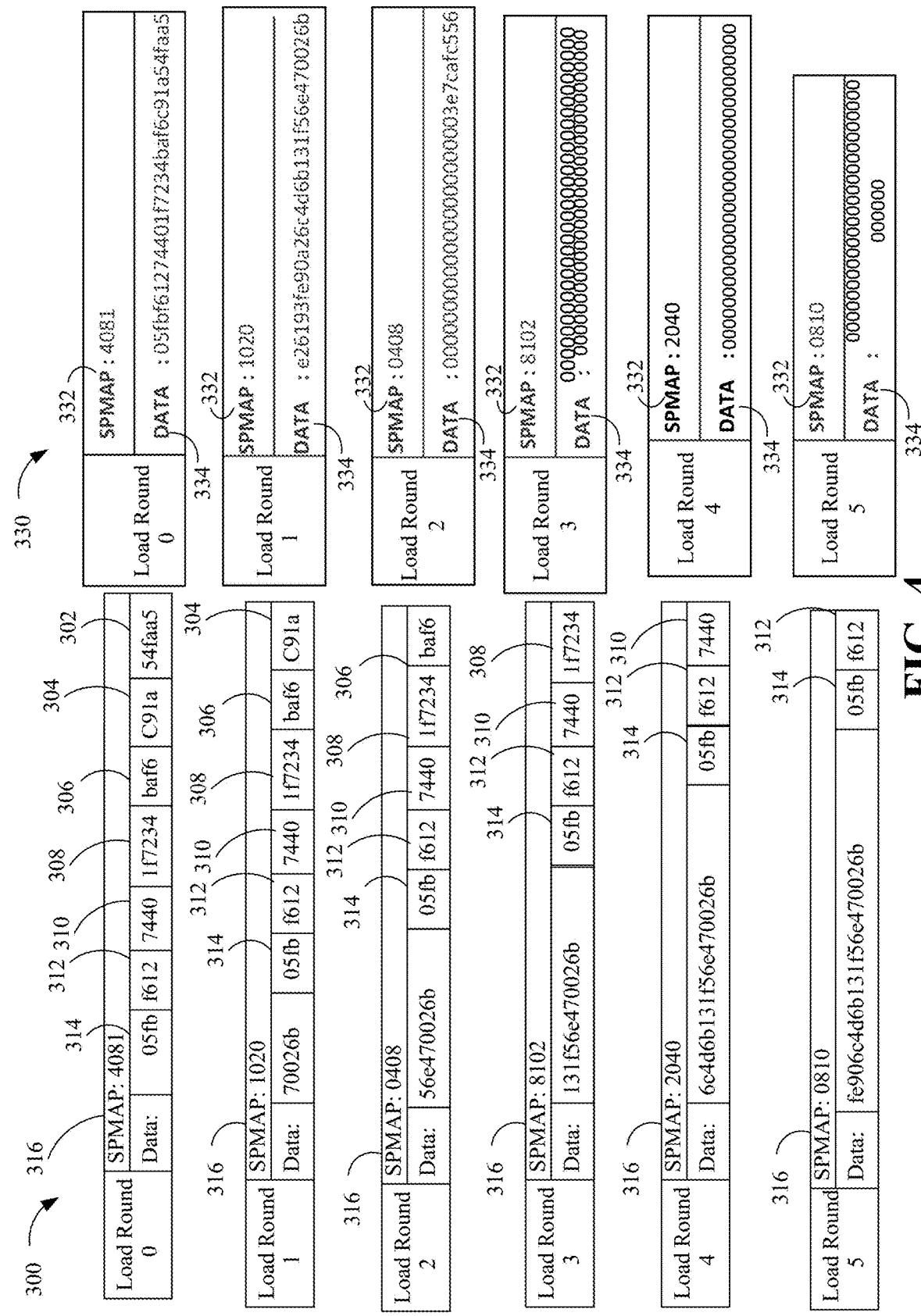
FIG. 4 is a diagram of an example of a sparsity decoding process according to an embodiment.

FIG. 4 illustrates a sparsity decoding process 300 and conventional load distribution process 330 to distribute data into a PE array. The sparsity decoding process 300 may generally be implemented with the embodiments described herein, for example, the enhanced DNN architecture 100 (FIG. 1), method 800 (FIG. 2) and/or an activation memory layout 402 (FIG. 3) already discussed. The data distribution in this example is at a 16-byte granularity for sparse compressed data that includes valid bytes 302, 304, 306, 308, 310, 312, 314 and data 334, and at a 2-byte granularity for SPMAPs 316, 332 for the corresponding data.

First, consider the conventional load distribution process 330 into the PE array without a sparsity-aware datastore as may be used in typical implementations. In this example, consider a 1×1×256 tensor, where 256 ICs are sparse compressed with random sparsity. The sparsity bitmap is 32-byte wide (i.e., 256/8). The sparse compressed data may be around 16 lines (e.g., L0-L15 of which L0-L5 are illustrated and L6-L15 are unillustrated), where the zeros are compressed, and the non-zero values are moved to the beginning of the lines while zeros are moved towards the end. Due to high sparsity level in the data, in this example, only 3 of the 16 lines have non-zero data values and the rest is all 0s. In the dense case, the conventional load distribution process 330 would take 16 rounds to load and distribute all the data.

The SPMAP 332 is dense, so it still takes 16 cycles to load the SPMAP 332, but after load round 2, the remaining load rounds will have valid values for the SPMAP 332, but the data 334 is all zeros. For example, in a load round 0, the SPMAP 332 is 0x4081 hexadecimal value (i.e., 100000010000001 binary value), which implies that only 3 valid bytes are present in the data, but the data 334 injects 16 valid bytes (i.e., all non-zero values). Thus, the loaded portion of the SPMAP 332 is not in synchronization with the loaded bytes of the data 334. Rather, portions of the SPMAP 332 that are loaded in later rounds will provide the exact position of the loaded valid bytes (e.g., positions of valid byte 4-16 since positions of valid bytes 1, 2, 3 are indicated by the loaded SPMAP) during loading. The data 334 and the value of the SPMAP 332 may be provided to a PE array. Notably the data 334 is unaligned with the SPMAP 332 such that each of the PEs have to decode and align the data 334 based on the SPMAP 332 that are pushed during load rounds 0-5.

Similarly, in load round 1, the SPMAP 332 is 0x1020 (i.e., 1000000100000), which provides the positions of only 2 valid bytes that were loaded in load round zero (e.g., byte positions 4 and 5 of load round zero or "1a" and "c9"). The process may continue as described above until the last portion of the SPMAP 332 is loaded (e.g., around 16 rounds).

Since the SPMAP 332 and data 334 are not in synchronization during the load such that the SPMAP 332 and data 334 may loaded in a specific round may not correspond to each other, the PE array would need to decode the sparsity and keep the load in synchronization throughout the process. For example the portion of the SPMAP 332 loaded in load round 2 and pushed to the PE array corresponds to data 334 loaded in load round 0. This logic needs to be replicated across the PE array, which increases area costs and energy consumption from redundant work, especially in scenarios of reuse where the same data is broadcasted to multiple PEs and they all have to do the same work.

Sparsity decoding process 300 is executed by a sparsity-aware smart datastore, such as datastore 106 (FIG. 1), for five rounds, where the data and SPMAP 316 are in synchronization during the load of the data (e.g., activations). Doing so may enhance efficiency, reduce power and enhance performance.

The SPMAP 316 provides positions of the valid bytes discussed below. For example, in load round 0 even though 16 bytes of data is loaded, the sparsity bitmap (SPMAP) 316 specifies only $1^{st}$-$3^{rd}$ valid bytes 302, so the PEs will only consume those three bytes. In this example, the SPMAP 316 has a hexadecimal value of 4081 which translates to a binary value of 0100000010000001. Thus, a decompressed value based on the SPMAP 316 and the $1^{st}$-$3^{rd}$ valid bytes 302 would be "054000000fa000000a5." In this example, the tile feeders, such as the tile feeders of the second partition 108 (FIG. 1), will send to the PE array, such as PE array 110, the $1^{st}$-$3_{rd}$ valid bytes 302 and the portion (4081) of the SPMAP 316 that corresponds to the $1^{st}$-$3^{rd}$ valid bytes 302. The $1^{st}$-$3^{rd}$ valid bytes 302 may not yet be decompressed based on the SPMAP 316 to reduce communicational bandwidth, but the $1^{st}$-$3^{rd}$ valid bytes 302 and the SPMAP 316 may be decoded, aligned data such that the PEs need not align the data. Rather, the PEs may simply decompress the $1^{st}$-$3^{rd}$ valid bytes 302 based on the SPMAP 316.

In the load round 1, the datastore will advance the data pointer by 3 valid bytes and resend the data in the $4^{th}$-$5^{th}$ byte 304. In this example, the SPMAP 316 has a hexadecimal value of 1020 which translates to a binary value of 0001000000100000. Thus, a decompressed value based on the SPMAP 316 and the $4^{th}$-$5^{th}$ byte 304 would be "000C90000001a00000." In this example and similar to the above, the tile feeders will send to the PE array, $4^{th}$-$5^{th}$ valid bytes 304 and the portion (1020) of the SPMAP 316 that corresponds to the $4^{h}$-$5^{th}$ valid bytes 304 and the PEs will execute the decompression.

Similarly, in load round 2, the datastore will advance the pointer by 2 bytes and send the data from the $6^{th}$-$7^{th}$ bytes 306. In this example, the SPMAP 316 has a hexadecimal value of 0408 which translates to a binary value of 010000001000. Thus, a decompressed value based on the SPMAP 316 and the $6^{th}$-$7^{th}$ bytes 306 would be "0ba000000f6000." In this example, the tile feeders will send to the PE array, $6^{th}$-$7^{th}$ valid bytes 306 and the portion (0408) of the SPMAP 316 that corresponds to the $6^{th}$-$7^{th}$ valid bytes 306 and the PEs will execute the decompression.

Similarly, in load round 3, the datastore will advance the pointer by 2 bytes and send the data from the $8^{th}$-$10^{th}$ bytes 308. In this example, the spmap 316 has a hexadecimal value of 8102 which translates to a binary value of 1000000100000010. Thus, a decompressed value based on the spmap 316 and the $8^{th}$-$10^{th}$ bytes 308 would be "1f00000072000000340." In this example, the tile feeders will send to the PE array, $8^{th}$-$10^{th}$ valid bytes 308 and the portion (8102) of the SPMAP 316 that corresponds to the $8^{th}$-$10^{rd}$ valid bytes 308.

In load round 4, the datastore will advance the pointer by 3 bytes and send the data from the $11^{th}$-$12^{th}$ valid bytes 310. In this example, the SPMAP 316 has a hexadecimal value of 2040 which translates to a binary value of 0010000001000000. Thus, a decompressed value based on the SPMAP 316 and the $11^{th}$-$12^{th}$ valid bytes 308 would be "007400000040000000." In this example, the tile feeders will send to the PE array, $11^{th}$-$12^{th}$ valid bytes 310 and the portion (2040) of the SPMAP 316 that corresponds to the $11^{th}$-$12^{th}$ valid bytes 310.

In load round 5, the datastore will advance the pointer by 2 bytes and send the data from the $13^{th}$-$14^{th}$ bytes 312. In this example, the SPMAP 316 has a hexadecimal value of 0810 which translates to a binary value of 0000100000010000. Thus, a decompressed value based on the SPMAP 316 and the $13^{th}$-$14^{th}$ bytes 312 would be "0000f6000000120000." In this example, the tile feeders will send to the PE array, $13^{th}$-$14^{th}$ valid bytes 312 and the portion (0810) of the SPMAP 316 that corresponds to the $13^{th}$-$14^{th}$ valid bytes 312. The process 300 may continue through load rounds until the data and SPMAP 316 are completed. In each load round, only data aligned data is sent to the PE array, thus simplifying operational costs and overhead.

Thus, the enhanced datastore that executes process 300 is equipped with sparsity decoding logic that counts the number of zeros, which the enhanced datastore uses to advance the data pointer across load rounds. This logic overhead for distribution of a tensor (e.g., 1×1×256) is entirely contained in one datastore instance, from which based on the reuse pattern the data can either feed one PE (unicast case) or all PEs (broadcast case). The datastore also treats the activation data (which correspond to input channels of tensors) as one contiguous stream and as it strips off bytes from the front of the stream based on the sparsity decoding and appends data to the end (e.g., far left portion of the data) for a next line of data from the on-chip memory.

As described herein in the description, [FX, FY, IX, OX, IY, OY, IC, OC, ON] will denote [Filter kernel X dimension, Filter kernel Y dimension, Input activation X dimension, Output activation X dimension, Input activation Y dimension, Output activation Y dimension, Number of input channels, Number of output channels, Batch size] respectively. Examples also use "IF" for input activations, "FL" for weights, "OF" for output activations, "Psum" for partial product in convolution.

As described herein in the description, in the schedule notation of the form (*/*/*), the $1^{st}$ term is the output dimension variable, $2^{nd}$ term is the blocking factor and the 3 term is the partitioning factor. For example, OX/IB/IP in Inner and OX/OB/1 in Outer loop respectively indicates that each processing element (PE) has IB number of X points and there are IP number of such identical PEs working on IP number of independent X's spread across the multiple PEs spatially while there are OB such outer rounds which are worked upon temporally.

In order to determine how much storage to provision for the datastore, some examples further include a tool to profile the network-level storage demand and its impact on performance and utilization. For example, the number of datastores may correspond to a number of desired contexts. For example, the contexts may correspond to the PEs (e.g., a 1:1 ratio for 64 contexts for 64 PEs). The sizing of the datastore was determined based on the network-level performance analysis relative size, which may be around a datastore of 64 instances which allows supporting any of the following tile sizes such as 8×8, 4×16, 2×32 that totals to 64. A datastore of 64 instances can be mapped to various tile configurations such as 8×8, 4×16, 16×4, etc. through the various flexible schedules which vary the blocking and partitioning for the X and Y dimensions as shown below. The notation "OXIB" is the X tensor's blocking factor and "OXIP" is the X tensor's partitioning factor and similarly for the OY. The inner blocking factor (IB) determines the volume of X and Y fed to a single PE in the first round and the partitioning factor (IP) determines the volume fed across the PE array in the first round. The blocking and partitioning may be configurable parameters that are determined by a compiler that attempts to maximize the utilization and performance of the DNN accelerator. The following provides some examples of various exemplary configurations:

4×4: OXIB=4, OXIP=1, OYIB=1, OYIP=4
8×8: OXIB=4, OXIP=2, OYIB=1, OYIP=8
4×16: OXIB=4, OXIP=1, OYIB=1, OYIP=16
16×4: OXIB=4, OXIP=4, OYIB=1, OYIP=4

This blocking and partitioning configuration based on the flexible schedule is used to activate the number of parallel tile walkers and tile feeders that populate the datastore and distributes activation data to the PE array.

Single Datastore Instance

Figure 5:
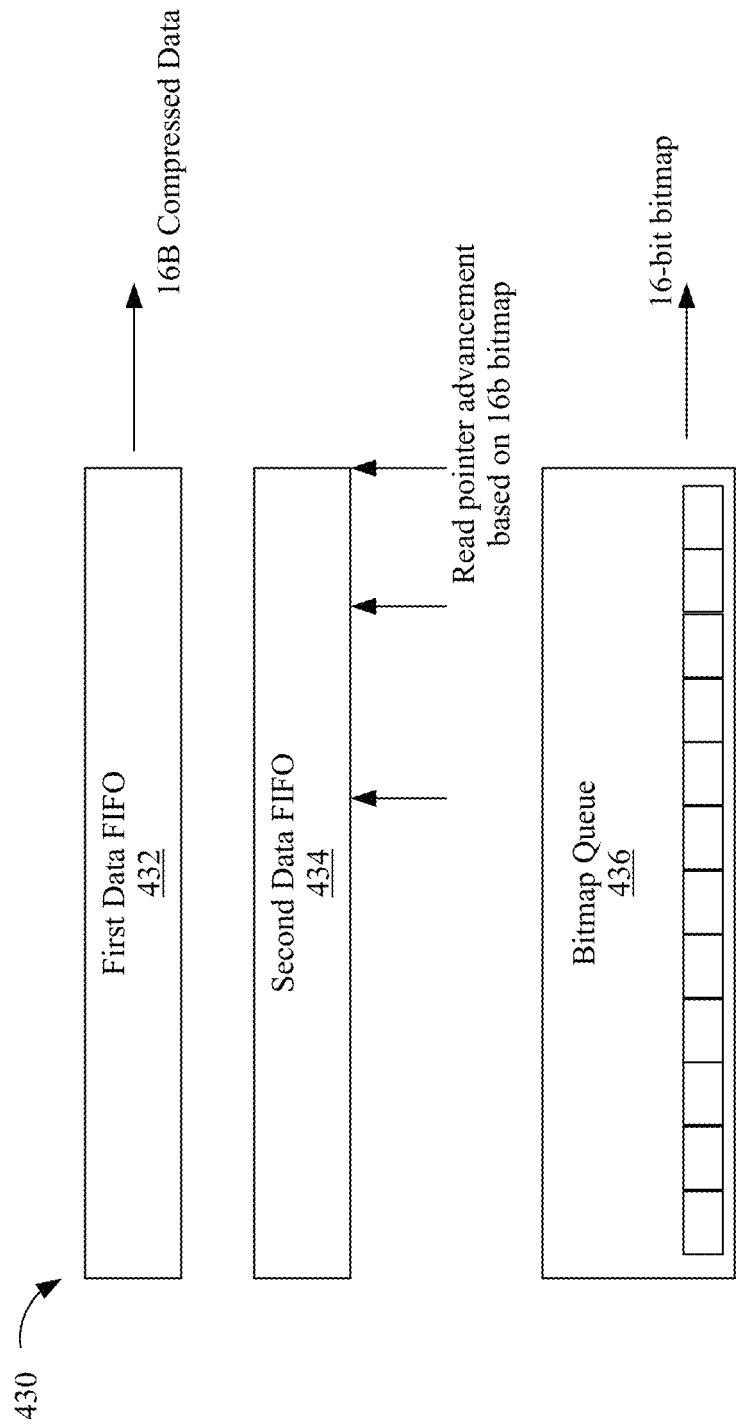
FIG. 5 is a diagram of an example of a datastore instance architecture according to an embodiment.

FIG. 5 illustrates a datastore instance architecture 430. The datastore instance architecture 430 may be readily incorporated with other embodiments as described herein. For example, the datastore 106 (FIG. 1) may include a plurality of datastore instance architectures 430 (e.g., 64) corresponding to PEs of the PE array 110 (FIG. 1). Based on the above, some examples of the sparsity-aware datastore support a tile configuration that translates to around 64 instances or databases. Each instance may be modeled as a circular buffer with a first and second data FIFO 432, 434 (e.g., 2×32B) which are storages for sparse compressed data and a bitmap queue 436 (e.g., 2×32B) that is a storage for a corresponding sparsity bitmap as shown in FIG. 5. The data into the first and second data FIFO 432, 434 and bitmap queue 436 are written based on a write index, where the sparse compressed data may be written at a first granularity (e.g., 16B or 32B) into the first and second data FIFO 432, 434, while the bitmap queue 436 may be written at a second granularity (e.g., any granularity) ranging from 2B to 32B.

The storage for the first and second data FIFO 432, 434 is modeled as a FIFO and the storage for the bitmap is modeled as a queue of having an entry size (e.g., 2B). This allows the write into the first and second data FIFO 432, 434 to be of any size, while the write and read from the bitmap queue is always at a fixed 2B granularity. During a read from the datastore instance architecture 430, a portion (e.g., 2B) of the bitmap queue 436 is popped out of the bitmap queue 436 and data (e.g., 16B) is popped out of first or second data FIFO 432, 434 to sparsity align the popped data and sent to the PE array. The PE array may then decompress the sparsity aligned data. That is, the decompression is executed in a respective PE of the PE array during convolution. In such a fashion, embodiments may save bandwidth during load into the PEs.

For example, in the datastore with the datastore instance architecture 430 and the tile feeder, the sparse data is not decompressed, but instead only aligned to ensure the sparse compressed data load is aligned with the SPMAP. The portion of the bitmap may also send through a popCount logic to compute the next read index for the data. In the case of dense data, some embodiments may send 16B of data starting from 0 and the next index of the data pointer is at 16. But in the case of sparse data, some embodiments may send 16B of data starting from 0 and the next index of the data pointer is computed from the popCount of the bitmap queue 436, which is based on the number of is in the bitmap.

Each instance of a datastore may include an architecture similar to the datastore instance architecture 430. The usage of the datastore in terms of how many circular buffer instances are occupied for a given network layer is driven by the inner tile size of the schedule. The structural layout and organization of these circular buffer instances enables a realization of the data distribution network for the DNN accelerator.

Flat 64-Instance Datastore Organization

Figure 6:
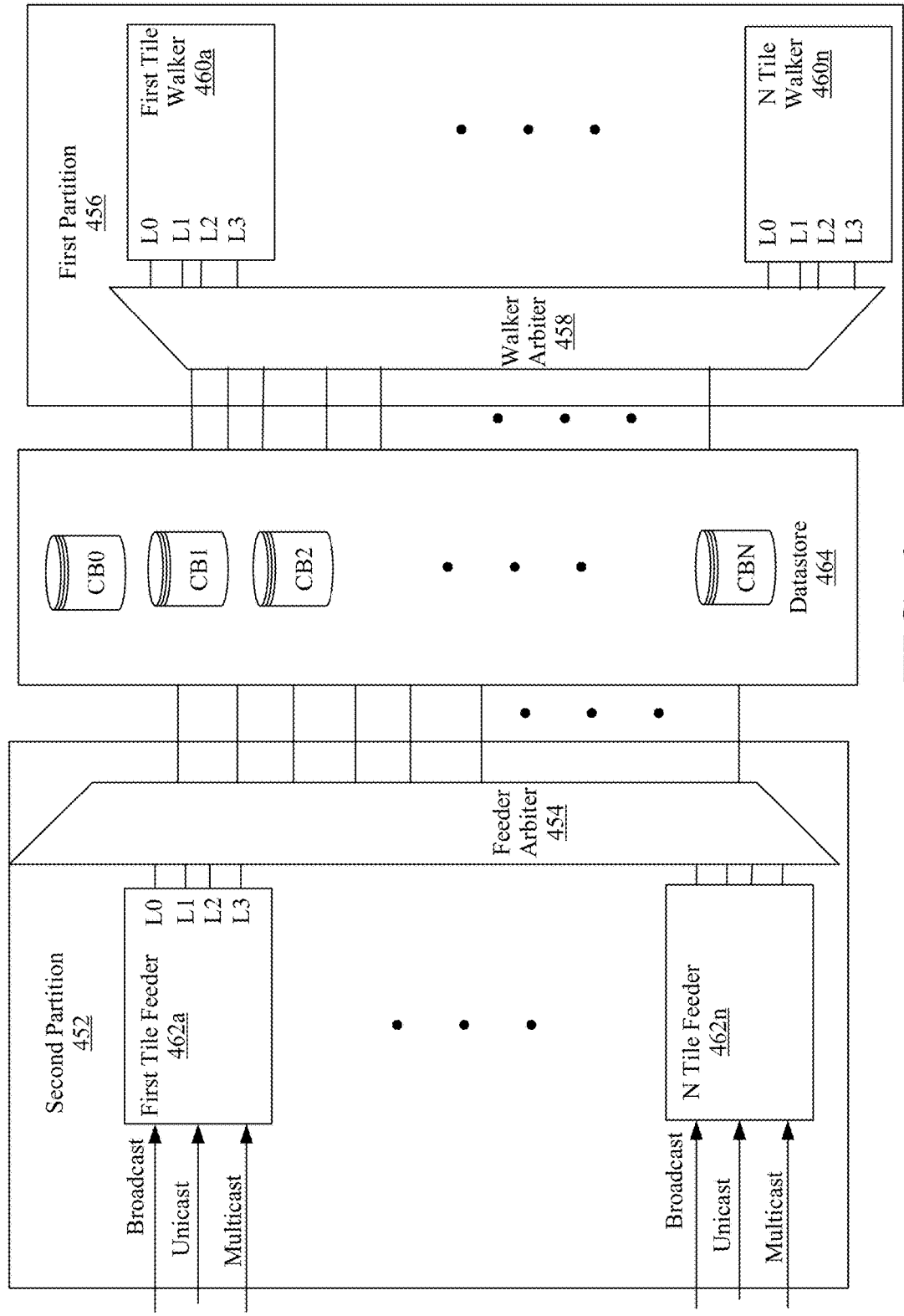
FIG. 6 is a diagram of an example of a flat datastore instance according to an embodiment.

Turning now to FIG. 6, an embodiment of a flat datastore instance 450 is now described. The flat datastore instance 450 may generally be implemented with the embodiments described herein, for example, the enhanced DNN architecture 100 (FIG. 1), method 800 (FIG. 2), an activation memory layout 402 (FIG. 3), sparsity decoding process 300 (FIG. 4) and datastore instance architecture 430 (FIG. 5)

already discussed. In the flat datastore instance 450, an (X,Y) value of a tensor is mapped to a particular datastore instance of the datastore instance CB0-CBN of datastore 464, and all input channels or ICs for this (X,Y) will be only stored in a circular buffer of the particular datastore. The datastore instance CB0-CBN are written to by a particular tile walker from a first tile walker 460a-460n tile walker 460n (any number of tile walkers may be included) of the first partition 456. The particular tile walker is responsible for fetching the tensor volume from on-chip memory 102 and storing the tensor volume in the appropriate datastore instance from the datastore instances CB0-CBN via walker arbiter 458 that is selected based on a X and Y values of the tensor volume (e.g., an address for the particular tile walker may be computed from the X and Y values).

Tile feeders 462a-462n (any number of tile feeders may be included) of a second partition 452 are responsible for reading from a datastore instance of the datastore instances CB0-CBN (e.g., read from a circular buffer) associated with a given (X,Y) and feeding the PE array via the feeder arbiter 454. That is, each X, Y value is mapped to a specific datastore instance of the datastore instances CB0-CBN.

The number of first-N tile walkers 460a-460n activated is determined by the bandwidth and latencies requirements for the layer. In the flat datastore instance 450, a maximum number (e.g., 16) and a minimum number (e.g., 4) of tile walkers of the first-N tile walkers 460a-460n may be activated at any given time based on the layer, which may include provisioning the maximum number of write ports to the datastore.

The number of first-N tile feeders 462a-462n instantiated is determined by the data distribution pattern (unicast, broadcast or multicast) to the PE array. For example, in the flat datastore instance 450, a maximum number (e.g., 16) in the case of a unicast distribution and a minimum number (e.g., 4 feeders) in the case of a broadcast distribution (more reuse) may be activated, which may include provisioning the maximum number of read ports to the flat datastore instance 450.

All of the first-N tile walkers 460a-460n and the first tile feeder-N tile feeder 462a-462n may write to or read from any of the datastore instances CB0-CBN. For example, if the number of the datastore instances CB0-CBN is 64 datastores, a 16×64-way multiplexer and a 64×16-way demultiplexer may be required to enable full access for request and response arbitration as shown in FIG. 6.

Figure 7B:
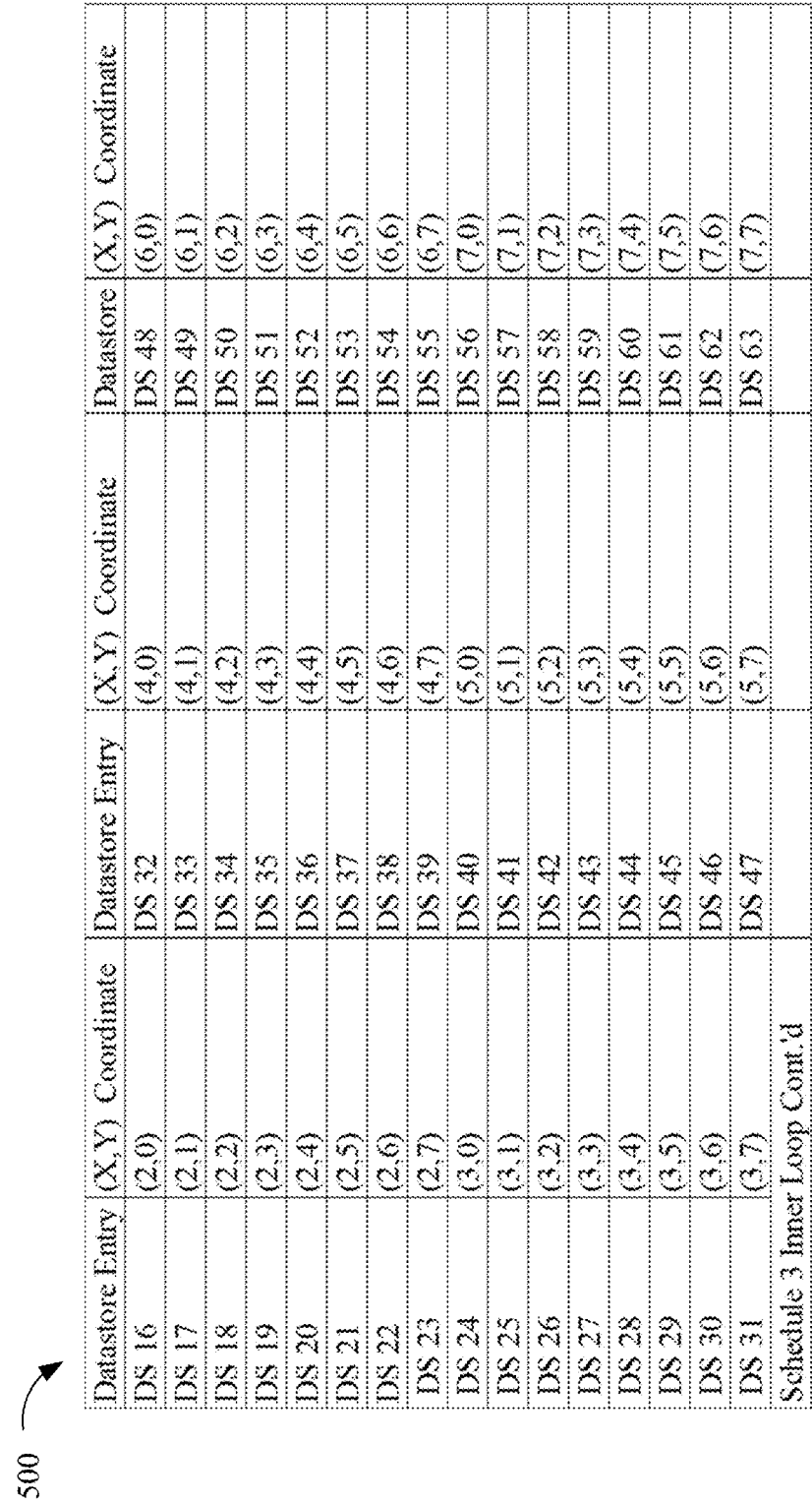

An example schedule and datastore mapping 500 for the inner tiles is shown in FIGS. 7A, 7B and 7C for the flat datastore instance 450. The schedule and datastore mapping 500 includes a schedule 1 inner loop 502, schedule 2 inner loop 504 and schedule 3 inner loop 506. Example pseudocode I related to the implementation of the schedule 1 inner loop 502, the schedule 2 inner loop 504 and the schedule 3 inner loop 506 is provided below:

Inner Loop of Schedule 1: OXIB=4, OXIP=1, OYIB=1, OYIP=4, ICIB=4 and ICIP=16=4×4×64 (Tile Volume)
Inner Loop of Schedule 2: OXIB=4, OXIP=2, OYIB=1, OYIP=2, ICIB=4 and ICIP=16=8×2×64 (Tile Volume)
Inner Loop of Schedule 3: OXIB=4, OXIP=2, OYIB=1, OYIP=8, ICIB=16 and ICIP=4=8×8×64 (Tile Volume)
Pseudocode I The flat datastore instance 450 shown in FIG. 6 provides enhanced flexibility as all of the first-N tile walkers 460a-460n and the first tile feeder-N tile feeder 462n may access all datastore instances CB0-CBN. The level of flexibility may include added hardware such as having a 16-to-64 demultiplexer and a 16-to-64 multiplexer, which may reduce the frequency achievable during the physical implementation of the 64-instance datastore due to the wiring congestion and the wire dominated timing paths.

The flat addressing scheme for a 1×1 convolution relied on the X and Y tensor coordinate to map them to a particular datastore as shown in FIGS. 7A, 7B and 7C. Pseudocode II below illustrates an addressing scheme:

$$\text{Flat Datastore Address}_{1\times1}(X,Y) = (X \% (OXIB*OXIP)) <<\log_2(OYIB*OYIP)) + (Y \% (OYIB*OYIP)) \quad \text{Pseudocode II}$$

Given that Pseudocode II relies on the absolute tensor coordinate value, in the case of N×N convolution, where filter size is greater than 1, the Pseudocode II may also be adjusted to take padding into account as shown below pseudocode III below:

$$\text{Flat Datastore Address}_{N\times N}(X,Y) = ((X-X\text{Pad}) \% (OXIB*OXIP) << \log_2(OYIB*OYIP)) + ((Y-Y\text{Pad}) \% (OYIB*OYIP)) \quad \text{Pseudocode III}$$

For strides greater than 1, Pseudocode IV also needed to take the stride into account as show below:

$$\text{Flat Datastore Address}_{final}(X,Y) = (((X-X\text{Pad}) >> \text{Stride}) \% (OXIB*OXIP) << \log_2(OYIB*OYIP)) + (((Y-Y\text{Pad}) >> \text{Stride}) \% (OYIB*OYIP)) \quad \text{Pseudocode IV}$$

The Stride value, Pad, value, OX and OY blocking and partitioning and their product may be statically determined based on the optimal schedule and programmed through CSRs. The address calculation may include several calculations (e.g., multiple modulo, shift and subtract operation) to be executed. Calculating the address may result in some frequency adjustments.

Synchronization may be required when two different tile walkers (e.g., first and second tile walkers) from the first tile walker-N tile walker 460a-460n populate the same datastore instances CB0-CBN. Each (X,Y) stored in a datastore is a unique context and the read and write of this context must be atomic. Due to the sparsity, there are scenarios where multiple tile walkers from the first tile walker-N tile walker 460a-460n may attempt to populate the same datastore instance from the datastore instances CB0-CBN. This will result in corrupting the two contexts that got mapped to the same datastore unless a synchronization point is added. The synchronization point prevents a second tile walker from the first tile walker-N tile walker 460a-460n from populating a same datastore of the datastore instances CB0-CBN until the first tile walker 460a has completed loading a current context.

Such synchronization may also be required during the reads to prevent multiple tile feeders from the first tile feeders 462a-462n from trying to read the same datastore for two different contexts. In the flat datastore organization these read-write conflicts may occur during N×N convolutions, where the N>1. For each FXFY round (9 such rounds for a layer with 3×3 filters), these conflicts arise and therefore explicit synchronization may be executed across these FXFY rounds.

As an example, consider an 8×8×64 tensor with a 3×3 filter. Some embodiments may activate 8 tile walkers from the first tile walker-N tile walker 460a-460n to fetch such a tensor volume. FIG. 7C illustrates the walk pattern 508 of the inner loop which may be implemented by the flat datastore instance 450 of FIG. 6. There are the 9 FXFY rounds as shown in the walk pattern 508.

Locations highlighted with a same outline (e.g., (0, 0, 32), (0, 0, 64) in FX=0, FY=0, for tile walker 0 and (0, 1, 32) and (0, 1, 64) in FX=0, FX=1) corresponds to the same X,Y coordinate, but different FXFY contexts and are mapped to the same datastore location. Between two FX rounds, the same coordinate is fetched by two different tile walkers. For example, consider coordinate (1,0) is fetched by tile walker 1 in (FX=0, FY=0) round and by tile walker 0 in (FX=1, FY=0) round. Now if the previous coordinate (0,0) fetched by tile walker 0 is highly sparse and the current coordinate (1,0) of round (FX=0, FX=1) is highly dense, then tile walker 0 may complete the fetch of (0,0) very fast and will move on to fetching (1,0) and populate the datastore. Since (1,0) is highly dense, tile walker 1 will not have completed fetching the coordinate and now there is a scenario where both tile walker 0 and 1 are populating the same datastore instance with the same (X,Y) but a different FXFY round.

To resolve this conflict of using the same datastore, an explicit synchronization may need to be executed, where all the tile walkers for a given FXFY round is only allowed to proceed to the next round once all of them have completed their walk and finished populating the current context to the respective datastore. The synchronization will also require the PEs that work on these FXFY rounds to also wait due to this synchronization.

Overlapping Banking 64-Instance Datastore Organization

Figure 8:
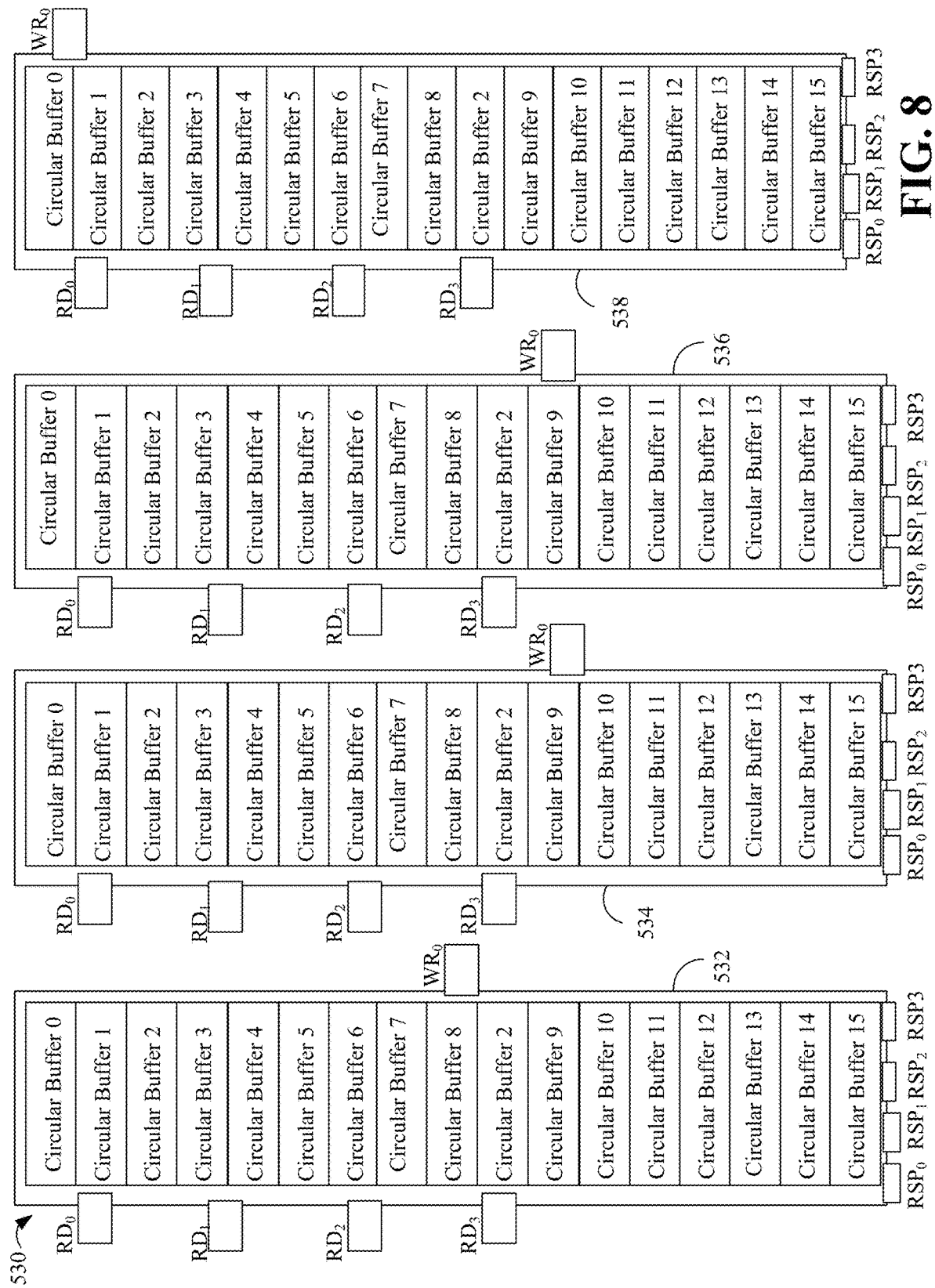
FIG. 8 is a diagram of an example of an overlapping banking datastore according to an embodiment.

Another example of a datastore is discussed in FIG. 8 as the overlapping banking datastore 530. The overlapping banking datastore 530 may be readily substituted for the datastore 106 (FIG. 1). The overlapping banking datastore 530 increase the achievable frequency. Embodiments include banking the overlapping banking datastore 530 into groups of four databanks 532, 534, 536, 538, where every databank of the databanks 532, 534, 536, 538 is constructed out of 16 datastore instances (circular buffers 0-15) as shown in FIG. 8.

This microarchitecture of the overlapping banking datastore 530 provides the following benefits:

a. A flexible and scalable address mapping scheme that is independent of the tensor (X,Y) coordinates stored in the datastore instance as opposed to relying on the absolute value of the X and Y to map the tensor to a datastore instance. The overlapping banking datastore 530 only relies on relative positions of the X and Y. The overlapping banking datastore 530 maps 4 Xs to the four databanks 532, 534, 536, 538 and all the Y for a particular X is mapped to datastore instances within a databank of the databanks 532, 534, 536, 538 that stores the particular X. Subsequent rounds of X and Y follow the same mapping.

b. Reduced number of read and write ports (e.g., 64 to 16).

c. Removal of the explicit requirement for walkers and feeders to synchronize allowing tile walkers and tile feeders to operate at the rate of the sparsity level in the data.

To simplify addressing to increase efficiency, overlapping banking datastore embodiments may fix the positions of the tensors based on the X and Y values. For example, X values of the tensors are mapped across the databanks 532, 534, 536, 538 so that a same X value is within a same bank of the databanks 532, 534, 536, 538, and the Y values of the tensors are mapped within the same bank. Doing so enhances the efficiency by simplifying the addressing for the datastore mapping.

FIG. 9 illustrates an address mapping 540 of the overlapping banking datastore 530 for schedule 3's inner loop from Pseudocode I. Each unique X value in the inner loop is fetched by a specified tile walker assigned to that particular unique X value. For example, X=0 is assigned to and fetched by tile walker 0, X=1 is assigned to and fetched tile walker 1 and so on. Furthermore, each tile walker is assigned to one databank of the databanks 532, 534, 536, 538 based on the addressing scheme. Thus, the tile walker fetching X=0 will never have to access the databanks for X=1-3 which consequently reduces the number of write ports needed for the databanks 532, 534, 536, 538. The entry rows 1-7 are all the Ys in the inner loop for a given X.

In schedule 3, there are 8 X values in the inner loop, which corresponds to 8 tile walkers. Given that the databanks 532, 534, 536, 538 include 4 databanks, a tile walker for X=0 and tile walker for X=4 will be mapped to the same bank which in this example is datastore bank 0. Thus, the tile walker for X=0 may write to entries 0-7 of the datastore bank 0, while the tile for X=4 may write to entries 8-15 of datastore bank 0. The address of the second set of 4 tile walkers is calculated as the OYIB*OYIP value, which in this case example is 8.

This simplification to the addressing scheme is made possible due to the banking structure and restricts the tile walkers to a set of unique Xs, which also reduces the total number of write ports required. Since the addressing doesn't rely on the absolute value of the coordinates and instead only on the OY blocking and partitioning factors of the inner loop to map X values of the tensors across banks and the Y of the tensors are within the bank to efficiently achieve a frequency target needed for the performance.

The datastore addressing scheme requires a bank address and an instance address, which is calculated as follows:

Num_of_$DB$=4

Num_of_$X$=OXIB*OXIP

Num_of_$Y$=OYIB*OYIP

Num_of_$X$_per_$DB$=Num_of_$X$/Num_of_$DB$

Foreach $db$ from Num_of_$DB$

Foreach $x$ from (Num_of_$X$_per_$DB$−1)

Foreach $y$ from (Num_of_$Y$−1)

Datastore Address $(X,Y,db)=(x*OYIP)+y$  Pseudocode V

In the banking arrangement and in Pseudocode V above, the overlapping banking datastore 530 is grouped into 4 databanks 532, 534, 536, 538 and hence Num_of_DB is 4. The number of datastore instances activated for a schedule is computed by multiplying the blocking and partitioning factor, which is identified in Num_of_X and Num_of_Y. The banking nature is achieved by splitting the X values across the bank. So, we compute total number of X values mapped per databank using the equation for Num_of_X_per_DB.

Each (X,Y) coordinate is mapped to a datastore instance (e.g., one of the circular buffers 0-15) within one of the databanks 532, 534, 536, 538 based on the X and Y position. The first X starts at databank 532, while the subsequent Xs are OYIP distance away. The first Y for the first X also starts at 0 and subsequent Ys for the same X are addressed using subsequent increments of 1.

The above identified addressing scheme may be executed with a 1×1 as well as an N×N where N>1, since examples do not rely on the absolute value of the X and Y coordinate but instead on the positional count. Since the addressing scheme doesn't rely on the actual (X,Y) value, stride and padding also doesn't impact the address calculation. All the Num_* variables in the Pseudocode V is computed based on the schedule parameters and programmed through CSRs.

This synchronization described above with respect to the flat datastore instance 450 is not required with the overlapping addressing scheme of the overlapping banking datastore 530 described above, where each tile walker is statically allocated a set of fixed datastore instances there is no sharing of datastore instances across the FXFY rounds. With the new addressing scheme, the eight tile walkers may fetch the same 8×8×64 tensor volume as shown in the layout 542 of FIG. 10.

As described in FIG. 10, in this embodiment, each tile walker may operate independently and on different portions of the databanks 532, 534, 536, 538. Thus, all of the data associated with tile walker 0 will be stored in a first portion of the databank 532 (e.g., circular buffers 0-7) while the data associated with tile walker 1 will be stored in a second portion of the databank 532 (e.g., circular buffers 8-15). Thus, there is no overlap between the first and second portions.

Across all FXFY round, the tile walkers fetch various (X,Y) context and overlap them into the same databank of the databanks 532, 534, 536, 538 allocated to the tile walker. When tile walker 0 fetches (0,0) tensor and (1,0) tensor, tile walker 0 stores using the (0,0) tensor and (1,0) within datastore instances within the same data bank that are separate from the datastore instances of tile walker 1. Notably, during each round, each tile walker is assigned a unique X value. The assignment of the X values to tile walkers may change between rounds. Doing so removes the need for synchronization and allows each tile walker and similarly a corresponding tile feeder to execute at a rate of the sparsity in the current context. That is, the tile walkers 0-7 write to different circular buffers 0-15 of the databanks 532, 534, 536, 538 so there is no potential conflict of writing to a same circular buffer.

The above embodiments may result in significant power and cost savings. For example, the amount of power consumed by a DNN (256 PEs) accelerator may achieve a 50% reduction in average power for sparsity handling distribution pattern in a multicast scenario. Further, in such examples, the power may be reduced to 75% in the case of broadcast style data distribution.

Figure 11:
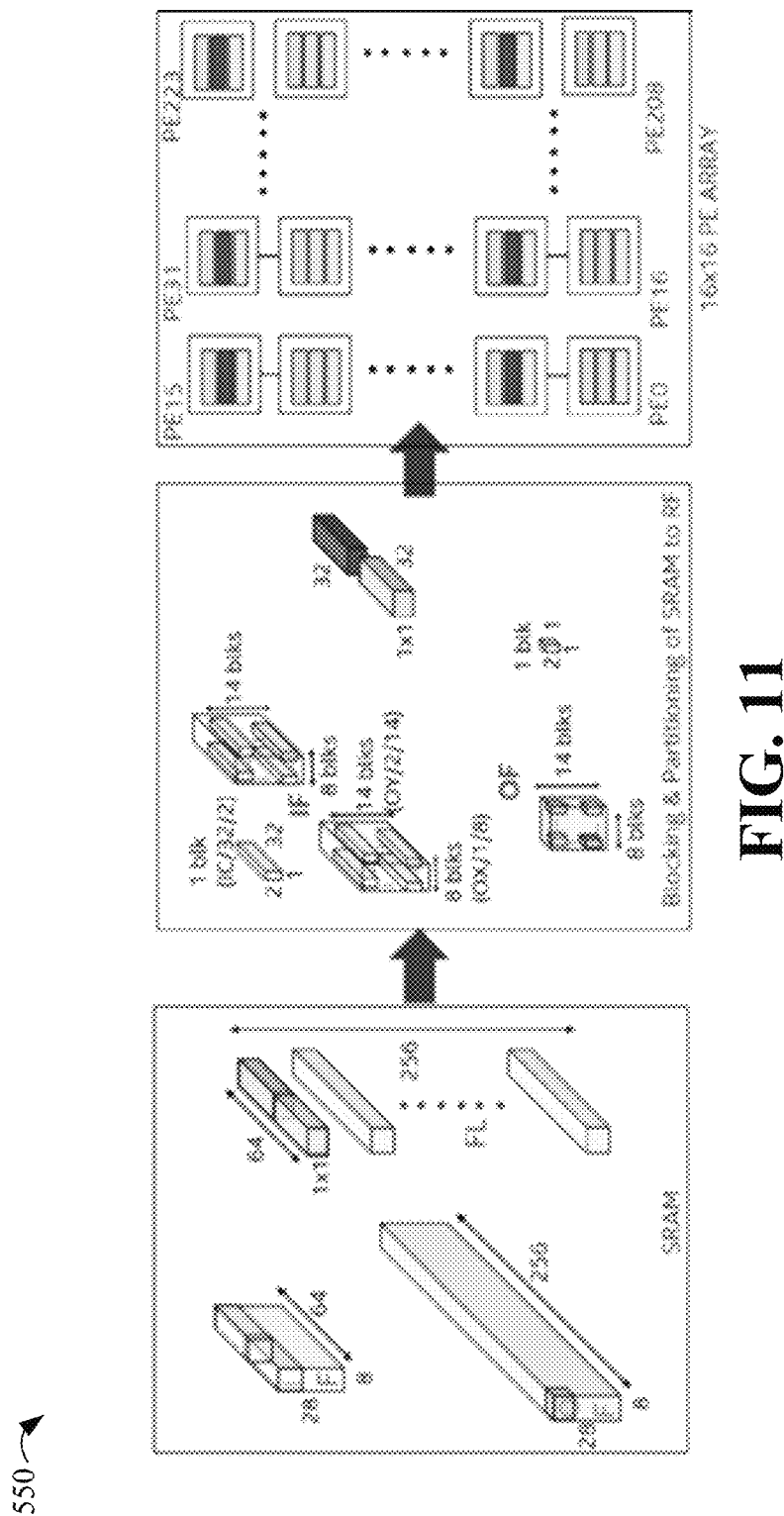
FIG. 11 is a diagram of an example of a schedule for a sample layer of a network according to an embodiment.

FIG. 11 illustrates a schedule 550 for a sample layer of a network (e.g., ResNet-101) network mapped to a 16×16 PE array represented as Inner Loop [OX/1/8, OY/2/14, IC/32/2] and Outer Loop [OC/256/1, OX/7/1, OY/2/1]. For the layer scale2a_branch1, its optimal schedule maps 8 partitions of 1 OX and 2 partitions of 32 IC to 16 rows and 14 partitions of 2 OY to 14 columns of the 16×16 PE array, respectively. Each PE takes 1 point of OX, 2 points of OY and 32 input channel (IC) points and generates partial sum for 2 OF points belonging to 1 output channel (OC). Therefore, the schedule 550 processes 64 IF points for 32 different IC, and 32 FL points for 32 different IC while producing 2 different OF points belonging to single OC. Note that since IC partitioning factor is 2 along a PE column, it implies 2 PEs are working on producing the final OF point and internal accumulation of the partial sum across 2 PEs need to occur before generating the final OF point. This results in 8 PEs producing final OF points within a column and 112 PEs in total (8 per column×14 columns) that are producing the final OF points. Inner loop produces 8 OX, 28 OY and 1 OC OF points. Remaining blocks of 256 OC, 7 OX, 2 OY are in the outer loops which yield the final volume of 56×56×256 OF points. Since IF is reused by outer loop OC, this dataflow is input activation stationary.

Figure 12:
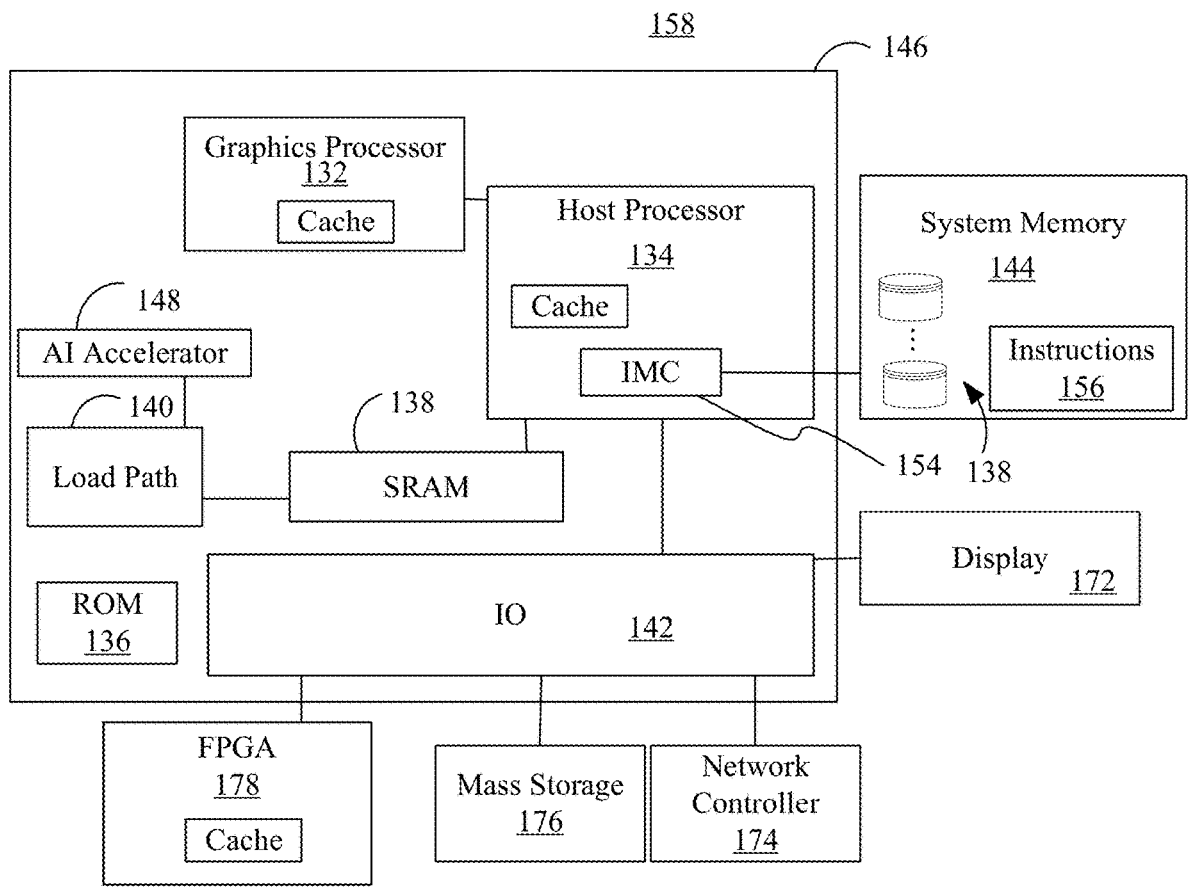
FIG. 12 is a block diagram of an example of an enhanced data distribution computing system according to an embodiment.

Turning now to FIG. 12, a performance enhanced computing system 158 is shown. The computing system 158 may generally be part of an electronic device/platform having computing functionality (e.g., personal digital assistant/PDA, notebook computer, tablet computer, convertible tablet, server), communications functionality (e.g., smart phone), imaging functionality (e.g., camera, camcorder), media playing functionality (e.g., smart television/TV), wearable functionality (e.g., watch, eyewear, headwear, footwear, jewelry), vehicular functionality (e.g., car, truck, motorcycle), robotic functionality (e.g., autonomous robot), etc., or any combination thereof. In the illustrated example, the computing system 158 includes a host processor 134 (e.g., CPU) having an integrated memory controller (IMC) 154 that is coupled to a system memory 144.

The illustrated computing system 158 also includes an input output (IO) module 142 implemented together with the host processor 134, a graphics processor 132 (e.g., GPU), ROM 136, AI accelerator 148, SRAM 138 and load path 140 on a semiconductor die 146 as a system on chip (SoC). The illustrated IO module 142 communicates with, for example, a display 172 (e.g., touch screen, liquid crystal display/LCD, light emitting diode/LED display), a network controller 174 (e.g., wired and/or wireless), FPGA 178 and mass storage 176 (e.g., hard disk drive/HDD, optical disk, solid state drive/SSD, flash memory). Furthermore, the SoC 146 may further include processors (not shown) and/or the AI accelerator 148 dedicated to artificial intelligence (AI) and/or neural network (NN) processing. For example, the system SoC 146 may include vision processing units (VPUs) and/or other AI/NN-specific processors such as AI accelerator 148, etc. In some embodiments, any aspect of the embodiments described herein may be implemented in the processors and/or accelerators dedicated to AI and/or NN processing such as AI accelerator 148, the graphics processor 132 and/or the host processor 134.

The graphics processor 132 and/or the host processor 134 may execute instructions 156 retrieved from the system memory 144 (e.g., a dynamic random-access memory) and/or the mass storage 176 to implement aspects as described herein to execute a compiler and program registers of the load path 140.

When the instructions 156 are executed, the computing system 158 may implement one or more aspects of the embodiments described herein. For example, the computing system 158 may implement one or more aspects of the sparsity decoding process 300 may generally be implemented with the embodiments described herein, for example, the enhanced DNN architecture 100 (FIG. 1), method 800 (FIG. 2), an activation memory layout 402 (FIG. 3), sparsity decoding process 300 (FIG. 4), datastore instance architecture 430 (FIG. 5), flat datastore instance 450 (FIG. 6), overlapping banking datastore 530 (FIG. 8), schedule 550 (FIG. 11) already discussed. The illustrated computing system 158 is therefore considered to be performance-enhanced at least to the extent that it enables the computing system 158 to efficiently retrieve and store data for AI related processes.

In this example, an SRAM 138 is coupled with a host processor 134. The host processor 134 may store data in the SRAM 138. The load path 140 may include first partition (e.g., tile walkers), a datastore, and a second partition (e.g., tile readers) to efficiently move data to the AI accelerator 148.

Figure 13:
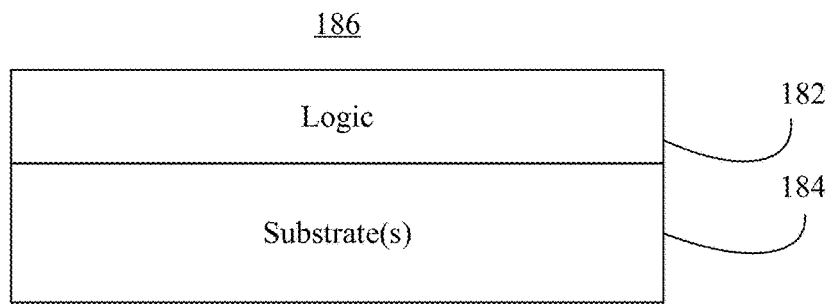
FIG. 13 is an illustration of an example of a semiconductor apparatus according to an embodiment.

FIG. 13 shows a semiconductor apparatus 186 (e.g., chip, die, package). The illustrated apparatus 186 includes one or more substrates 184 (e.g., silicon, sapphire, gallium arsenide) and logic 182 (e.g., transistor array and other integrated circuit/IC components) coupled to the substrate(s)

184. In an embodiment, the apparatus 186 is operated in an application development stage and the logic 182 performs one or more aspects of the embodiments described herein, for example, the DNN architecture 100 (FIG. 1), method 800 (FIG. 2), an activation memory layout 402 (FIG. 3), sparsity decoding process 300 (FIG. 4), datastore instance architecture 430 (FIG. 5), flat datastore instance 450 (FIG. 6), overlapping banking datastore 530 (FIG. 8), schedule 550 (FIG. 11) already discussed. The logic 182 may be implemented at least partly in configurable logic or fixed-functionality hardware logic. In one example, the logic 182 includes transistor channel regions that are positioned (e.g., embedded) within the substrate(s) 184. Thus, the interface between the logic 182 and the substrate(s) 184 may not be an abrupt junction. The logic 182 may also be considered to include an epitaxial layer that is grown on an initial wafer of the substrate(s) 184.

Figure 14:
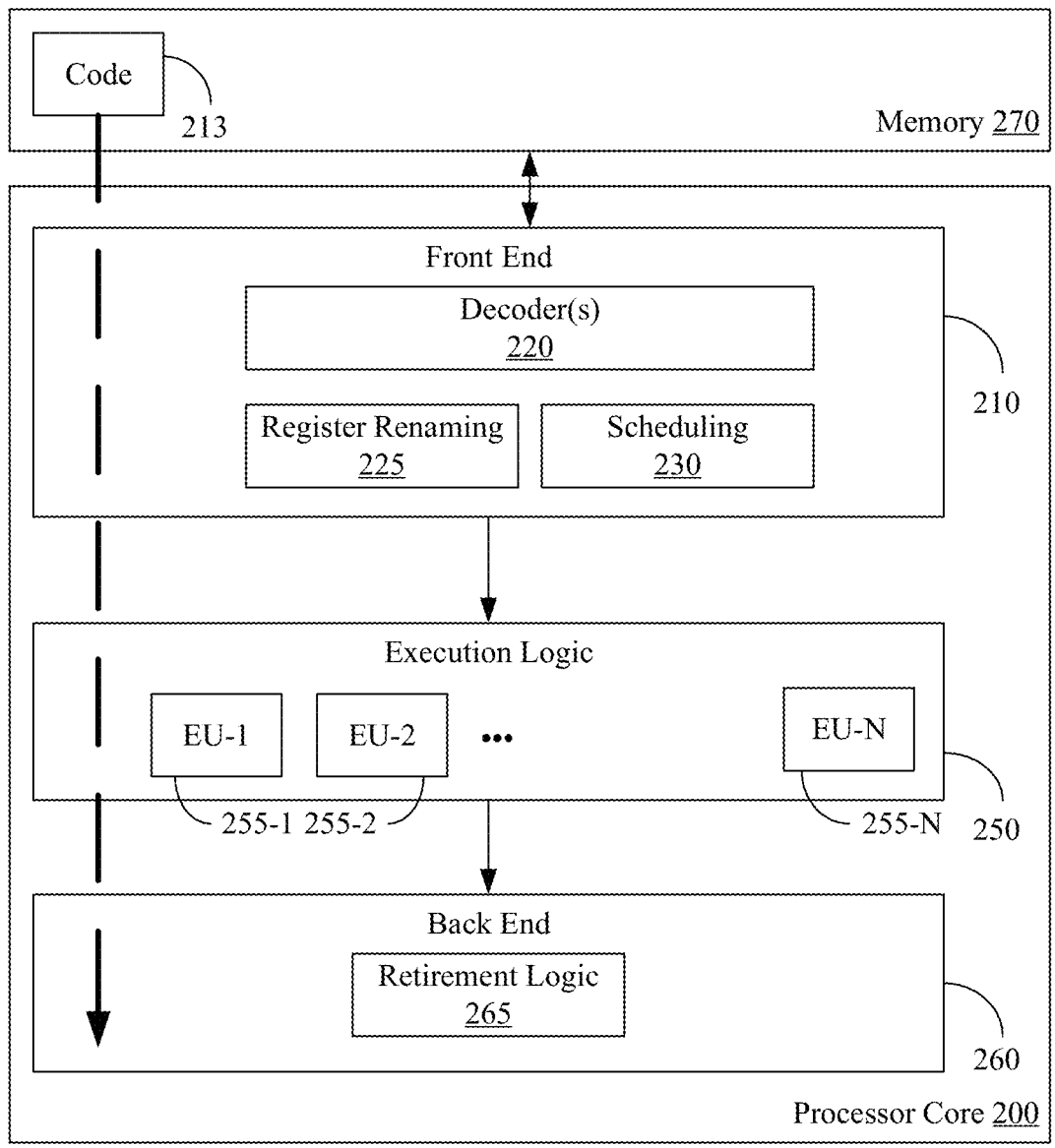
FIG. 14 is a block diagram of an example of a processor according to an embodiment.

FIG. 14 illustrates a processor core 200 according to one embodiment. The processor core 200 may be the core for any type of processor, such as a micro-processor, an embedded processor, a digital signal processor (DSP), a network processor, or other device to execute code. Although only one processor core 200 is illustrated in FIG. 14, a processing element may alternatively include more than one of the processor core 200 illustrated in FIG. 14. The processor core 200 may be a single-threaded core or, for at least one embodiment, the processor core 200 may be multithreaded in that it may include more than one hardware thread context (or "logical processor") per core.

FIG. 14 also illustrates a memory 270 coupled to the processor core 200. The memory 270 may be any of a wide variety of memories (including various layers of memory hierarchy) as are known or otherwise available to those of skill in the art. The memory 270 may include one or more code 213 instruction(s) to be executed by the processor core 200, wherein the code 213 may implement one or more aspects of the embodiments such as, for example, enhanced DNN architecture 100 (FIG. 1), method 800 (FIG. 2), an activation memory layout 402 (FIG. 3), sparsity decoding process 300 (FIG. 4), datastore instance architecture 430 (FIG. 5), flat datastore instance 450 (FIG. 6), overlapping banking datastore 530 (FIG. 8), schedule 550 (FIG. 11) already discussed. The processor core 200 follows a program sequence of instructions indicated by the code 213. Each instruction may enter a front end portion 210 and be processed by one or more decoders 220. The decoder 220 may generate as its output a micro operation such as a fixed width micro operation in a predefined format, or may generate other instructions, microinstructions, or control signals which reflect the original code instruction. The illustrated front end portion 210 also includes register renaming logic 225 and scheduling logic 230, which generally allocate resources and queue the operation corresponding to the convert instruction for execution.

The processor core 200 is shown including execution logic 250 having a set of execution units 255-1 through 255-N. Some embodiments may include a number of execution units dedicated to specific functions or sets of functions. Other embodiments may include only one execution unit or one execution unit that can perform a particular function. The illustrated execution logic 250 performs the operations specified by code instructions.

After completion of execution of the operations specified by the code instructions, back end logic 260 retires the instructions of the code 213. In one embodiment, the processor core 200 allows out of order execution but requires in order retirement of instructions. Retirement logic 265 may take a variety of forms as known to those of skill in the art (e.g., re-order buffers or the like). In this manner, the processor core 200 is transformed during execution of the code 213, at least in terms of the output generated by the decoder, the hardware registers and tables utilized by the register renaming logic 225, and any registers (not shown) modified by the execution logic 250.

Although not illustrated in FIG. 14, a processing element may include other elements on chip with the processor core 200. For example, a processing element may include memory control logic along with the processor core 200. The processing element may include I/O control logic and/or may include I/O control logic integrated with memory control logic. The processing element may also include one or more caches.

Figure 15:
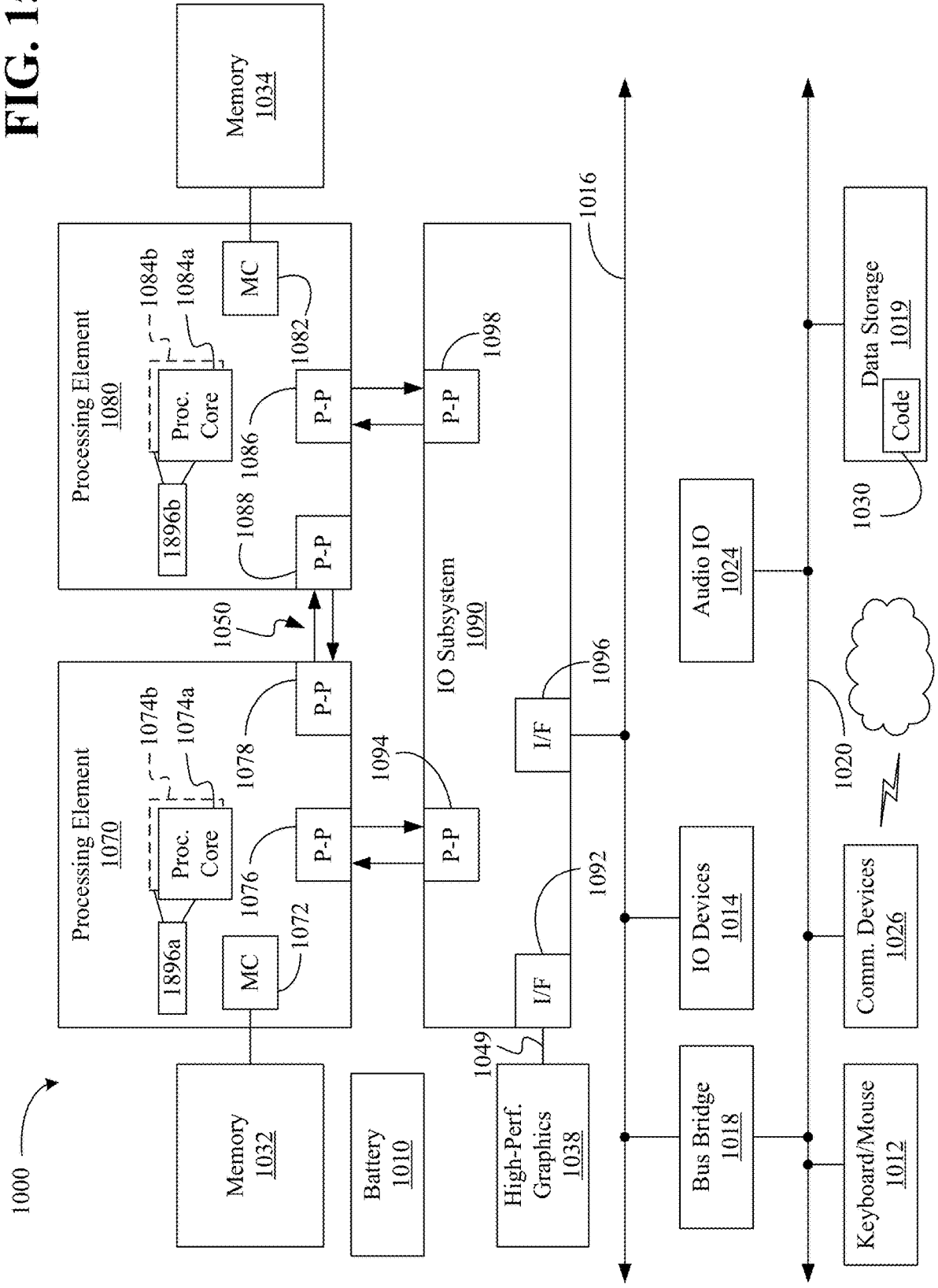
FIG. 15 is a block diagram of an example of a multi-processor based computing system according to an embodiment.

Referring now to FIG. 15, shown is a block diagram of a computing system 1000 embodiment in accordance with an embodiment. Shown in FIG. 15 is a multiprocessor system 1000 that includes a first processing element 1070 and a second processing element 1080. While two processing elements 1070 and 1080 are shown, it is to be understood that an embodiment of the system 1000 may also include only one such processing element.

The system 1000 is illustrated as a point-to-point interconnect system, wherein the first processing element 1070 and the second processing element 1080 are coupled via a point-to-point interconnect 1050. It should be understood that any or all of the interconnects illustrated in FIG. 15 may be implemented as a multi-drop bus rather than point-to-point interconnect.

As shown in FIG. 15, each of processing elements 1070 and 1080 may be multicore processors, including first and second processor cores (i.e., processor cores 1074a and 1074b and processor cores 1084a and 1084b). Such cores 1074a, 1074b, 1084a, 1084b may be configured to execute instruction code in a manner similar to that discussed above in connection with FIG. 14.

Each processing element 1070, 1080 may include at least one shared cache 1896a, 1896b. The shared cache 1896a, 1896b may store data (e.g., instructions) that are utilized by one or more components of the processor, such as the cores 1074a, 1074b and 1084a, 1084b, respectively. For example, the shared cache 1896a, 1896b may locally cache data stored in a memory 1032, 1034 for faster access by components of the processor. In one or more embodiments, the shared cache 1896a, 1896b may include one or more mid-level caches, such as level 2 (L2), level 3 (L3), level 4 (L4), or other levels of cache, a last level cache (LLC), and/or combinations thereof.

While shown with only two processing elements 1070, 1080, it is to be understood that the scope of the embodiments is not so limited. In other embodiments, one or more additional processing elements may be present in a given processor. Alternatively, one or more of processing elements 1070, 1080 may be an element other than a processor, such as an accelerator or a field programmable gate array. For example, additional processing element(s) may include additional processors(s) that are the same as a first processor 1070, additional processor(s) that are heterogeneous or asymmetric to processor a first processor 1070, accelerators (such as, e.g., graphics accelerators or digital signal processing (DSP) units), field programmable gate arrays, or any other processing element. There can be a variety of differences between the processing elements 1070, 1080 in terms of a spectrum of metrics of merit including architectural, micro architectural, thermal, power consumption characteristics, and the like. These differences may effectively manifest themselves as asymmetry and heterogeneity amongst the processing elements 1070, 1080. For at least one embodiment, the various processing elements 1070, 1080 may reside in the same die package.

The first processing element 1070 may further include memory controller logic (MC) 1072 and point-to-point (P-P) interfaces 1076 and 1078. Similarly, the second processing element 1080 may include a MC 1082 and P-P interfaces 1086 and 1088. As shown in FIG. 15, MC's 1072 and 1082 couple the processors to respective memories, namely a memory 1032 and a memory 1034, which may be portions of main memory locally attached to the respective processors. While the MC 1072 and 1082 is illustrated as integrated into the processing elements 1070, 1080, for alternative embodiments the MC logic may be discrete logic outside the processing elements 1070, 1080 rather than integrated therein.

The first processing element 1070 and the second processing element 1080 may be coupled to an I/O subsystem 1090 via P-P interconnects 1076 1086, respectively. As shown in FIG. 15, the I/O subsystem 1090 includes P-P interfaces 1094 and 1098. Furthermore, I/O subsystem 1090 includes an interface 1092 to couple I/O subsystem 1090 with a high performance graphics engine 1038. In one embodiment, bus 1049 may be used to couple the graphics engine 1038 to the I/O subsystem 1090. Alternately, a point-to-point interconnect may couple these components.

In turn, I/O subsystem 1090 may be coupled to a first bus 1016 via an interface 1096. In one embodiment, the first bus 1016 may be a Peripheral Component Interconnect (PCI) bus, or a bus such as a PCI Express bus or another third generation I/O interconnect bus, although the scope of the embodiments is not so limited.

As shown in FIG. 15, various I/O devices 1014 (e.g., biometric scanners, speakers, cameras, sensors) may be coupled to the first bus 1016, along with a bus bridge 1018 which may couple the first bus 1016 to a second bus 1020. In one embodiment, the second bus 1020 may be a low pin count (LPC) bus. Various devices may be coupled to the second bus 1020 including, for example, a keyboard/mouse 1012, communication device(s) 1026, and a data storage unit 1019 such as a disk drive or other mass storage device which may include code 1030, in one embodiment. The illustrated code 1030 may implement the one or more aspects of such as, for example, the enhanced DNN architecture 100 (FIG. 1), method 800 (FIG. 2), an activation memory layout 402 (FIG. 3), sparsity decoding process 300 (FIG. 4), datastore instance architecture 430 (FIG. 5), flat datastore instance 450 (FIG. 6), overlapping banking datastore 530 (FIG. 8), schedule 550 (FIG. 11) already discussed. Further, an audio I/O 1024 may be coupled to second bus 1020 and a battery 1010 may supply power to the computing system 1000.

Note that other embodiments are contemplated. For example, instead of the point-to-point architecture of FIG. 15, a system may implement a multi-drop bus or another such communication topology. Also, the elements of FIG. 15 may alternatively be partitioned using more or fewer integrated chips than shown in FIG. 15.

ADDITIONAL NOTES AND EXAMPLES

Example 1 includes a computing system comprising a plurality of processing elements a memory to store compressed data associated with a plurality of tensors and a sparsity bitmap, wherein the compressed data is to be in a compressed format, and a decode buffer that includes logic implemented at least partly in one or more of configurable or fixed-functionality hardware, the logic to prefetch the compressed data from the memory, align the compressed data with the sparsity bitmap to generate decoded data, and provide the decoded data to the plurality of processing elements.

Example 2 includes the computing system of Example 1, wherein the logic is to distribute the decoded data to the plurality of processing elements based on individual rates of consumption of the plurality of processing elements.

Example 3 includes the computing system of any one of Examples 1 to 2, wherein the decode buffer includes a plurality of datastores that include a plurality of buffers, and wherein the logic is to store the compressed data in the plurality of datastores based on X values and Y values associated with the tensors.

Example 4 includes the computing system of any one of Examples 1 to 2, wherein the decode buffer includes a plurality of datastores that include a plurality of buffers, wherein the plurality of datastores includes a first group of datastores and a second group of datastores, the logic includes a plurality of writing portions that are implemented at least partly in one or more of configurable or fixed-functionality hardware, and the logic is to control a first writing portion of the plurality of writing portions to write to the first group of datastores, wherein the second group of datastores is inaccessible to the first writing portion.

Example 5 includes the computing system of Example 1, wherein the decode buffer includes a plurality of buffers, the logic includes a writing portion that is implemented at least partly in one or more of configurable or fixed-functionality hardware, and wherein the logic is to control the writing portion to access any of the plurality of buffers to execute write operations based on X and Y values associated with the plurality of tensors.

Example 6 includes the computing system of any one of Examples 1 to 5, wherein the logic is to align a first portion of the compressed data with a first portion of the sparsity bitmap, and provide the first portion of the compressed data with the first portion of the sparsity bitmap to the plurality of processing elements to bypass a provision of unaligned portions of the compressed data and the sparsity bitmap to the processing elements.

Example 7 includes a semiconductor apparatus comprising one or more substrates, and logic coupled to the one or more substrates, wherein the logic is implemented in one or more of configurable or fixed-functionality hardware, the logic to prefetch compressed data and a sparsity bitmap from a memory to store the compressed data in a decode buffer, wherein the compressed data is associated with a plurality of tensors, wherein the compressed data is to be in a compressed format, align the compressed data with the sparsity bitmap to generate decoded data, and provide the decoded data to a plurality of processing elements.

Example 8 includes the apparatus of Example 7, wherein the logic is to distribute the decoded data to the processing elements based on individual rates of consumption of the processing elements.

Example 9 includes the apparatus of any one of Examples 7 to 8, wherein the decode buffer includes a plurality of datastores that include a plurality of buffers, and the logic is to store the compressed data in the plurality of datastores based on X values and Y values associated with the tensors.

Example 10 includes the apparatus of any one of Examples 7 to 8, wherein the decode buffer includes a plurality of datastores that include a plurality of buffers, wherein the plurality of datastores includes a first group of datastores and a second group of datastores, the logic includes a plurality of writing portions that are implemented at least partly in one or more of configurable or fixed-functionality hardware, and the logic is to control a first writing portion of the plurality of writing portions to write to the first group of datastores, wherein the second group of datastores is inaccessible to the first writing portion.

Example 11 includes the apparatus of Example 7, wherein the decode buffer includes a plurality of buffers, the logic includes a writing portion that is implemented at least partly in one or more of configurable or fixed-functionality hardware, and wherein the logic is to is to control the writing portion to access any of the plurality of buffers to execute write operations based on X and Y values associated with the plurality of tensors.

Example 12 includes the apparatus of any one of Examples 7 to 11, wherein the logic is to align a first portion of the compressed data with a first portion of the sparsity bitmap, and provide the first portion of the compressed data with the first portion of the sparsity bitmap to the plurality of processing elements to bypass a provision of unaligned portions of the compressed data and the sparsity bitmap to the processing elements.

Example 13 includes the apparatus of any one of Examples 7 to 12, wherein the logic includes transistor channel regions that are positioned within the one or more substrates.

Example 14 includes at least one computer readable storage medium comprising a set of executable program instructions, which when executed by a computing system, cause the computing system to prefetch compressed data and a sparsity bitmap from a memory to store the compressed data in a decode buffer, wherein the compressed data is associated with a plurality of tensors, wherein the data is to be in a compressed format, align the compressed data with the sparsity bitmap to generate decoded data, and provide the decoded data to a plurality of processing elements.

Example 15 includes the at least one computer readable storage medium of Example 14, wherein the executable program instructions, when executed, further cause the computing system to distribute the decoded data to the processing elements based on individual rates of consumption of the processing elements.

Example 16 includes the at least one computer readable storage medium of any one of Examples 14 to 15, wherein the decode buffer includes a plurality of datastores that include a plurality of buffers, and the executable program instructions, when executed, further cause the computing system to store the compressed data in the plurality of datastores based on X values and Y values associated with the tensors.

Example 17 includes the at least one computer readable storage medium of any one of Examples 14 to 15, wherein the executable program instructions, when executed, further cause the computing system to control a first writing portion of a plurality of writing portions to write to a first group of datastores of the decode buffer, wherein a second group of datastores of the decode buffer is inaccessible to the first writing portion, wherein the plurality of writing portions are implemented at least partly in one or more of configurable or fixed-functionality hardware.

Example 18 includes the at least one computer readable storage medium of Example 14, wherein the decode buffer includes a plurality of buffers, and wherein the executable program instructions, when executed, further cause the computing system to control a writing portion, that is implemented at least partly in one or more of configurable or fixed-functionality hardware, to access any of the plurality of buffers to execute write operations based on X and Y values associated with the plurality of tensors.

Example 19 includes the at least one computer readable storage medium of any one of Examples 14 to 18, wherein the executable program instructions, when executed, further cause the computing system to align a first portion of the compressed data with a first portion of the sparsity bitmap, and provide the first portion of the compressed data with the first portion of the sparsity bitmap to the plurality of processing elements to bypass a provision of unaligned portions of the compressed data and the sparsity bitmap to the processing elements.

Example 20 includes a method comprising prefetching compressed data and a sparsity bitmap from a memory to store the compressed data in a decode buffer, wherein the compressed data is associated with a plurality of tensors, wherein the compressed data is in a compressed format, aligning the compressed data with the sparsity bitmap to generate decoded data, and providing the decoded data to a plurality of processing elements.

Example 21 includes the method of Example 20, further comprising distributing the decoded data to the processing elements based on individual rates of consumption of the processing elements.

Example 22 includes the method of any one of Examples 20 to 21, wherein the decode buffer includes a plurality of datastores that include a plurality of buffers, and the method further includes storing the compressed data in the plurality of datastores based on X values and Y values associated with the tensors.

Example 23 includes the method of any one of Examples 20 to 21, further comprising controlling a first writing portion of a plurality of writing portions to write to a first group of datastores of the decode buffer, wherein a second group of datastores of the decode buffer is inaccessible to the first writing portion, wherein the plurality of writing portions is implemented at least partly in one or more of configurable or fixed-functionality hardware.

Example 24 includes the method of Example 20, wherein the decode buffer includes a plurality of buffers, and wherein the method further comprises controlling a plurality of writing portions, that are implemented at least partly in one or more of configurable or fixed-functionality hardware, to access any of the plurality of buffers to execute write operations based on X and Y values associated with the plurality of tensors.

Example 25 includes the method of any one of Examples 20 to 24, wherein the method further comprises aligning a first portion of the compressed data with a first portion of the sparsity bitmap, and providing the first portion of the compressed data with the first portion of the sparsity bitmap to the plurality of processing elements to bypass a provision of unaligned portions of the compressed data and the sparsity bitmap to the processing elements.

Example 26 includes an apparatus comprising prefetching compressed data and a sparsity bitmap from a memory to store the compressed data in a decode buffer, wherein the compressed data is associated with a plurality of tensors, wherein the compressed data is in a compressed format, aligning the compressed data with the sparsity bitmap to generate decoded data, and providing the decoded data to a plurality of processing elements.

Example 27 includes the apparatus of Example 26, further comprising distributing the decoded data to the processing elements based on individual rates of consumption of the processing elements.

Example 28 includes the apparatus of any one of Examples 26 to 27, wherein the decode buffer includes a plurality of datastores that include a plurality of buffers, and the apparatus further includes means for storing the compressed data in the plurality of datastores based on X values and Y values associated with the tensors.

Example 29 includes the apparatus of any one of Examples 26 to 27, further comprising means for controlling a first writing portion of a plurality of writing portions to write to a first group of datastores of the decode buffer, wherein a second group of datastores of the decode buffer is inaccessible to the first writing portion, wherein the plurality of writing portions is implemented at least partly in one or more of configurable or fixed-functionality hardware.

Example 30 includes the apparatus of Example 26, wherein the decode buffer includes a plurality of buffers, and wherein the apparatus further comprises means for controlling a plurality of writing portions, that are implemented at least partly in one or more of configurable or fixed-functionality hardware, to access any of the plurality of buffers to execute write operations based on X and Y values associated with the plurality of tensors.

Example 31 includes the apparatus of any one of Examples 26 to 30, wherein the apparatus further comprises means for aligning a first portion of the compressed data with a first portion of the sparsity bitmap, and means for providing the first portion of the compressed data with the first portion of the sparsity bitmap to the plurality of processing elements to bypass a provision of unaligned portions of the compressed data and the sparsity bitmap to the processing elements.

Thus, technology described herein may provide for an enhanced retrieval, storage and distribution of data. Furthermore, some embodiments as described herein may provide aligned data to the PEs to reduce communicational overhead while also reducing power usage, hardware and area.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrases "one or more of A, B or C" may mean A, B, C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. A computing system comprising:
a plurality of processing elements;
a memory to store compressed data associated with a plurality of tensors and a sparsity bitmap, wherein the compressed data is to be in a compressed format; and
a decode buffer that includes logic implemented at least partly in one or more of configurable or fixed-functionality hardware, the logic to:
prefetch the compressed data from the memory;
align the compressed data with the sparsity bitmap to generate decoded data; and
provide the decoded data to the plurality of processing elements.

2. The computing system of claim 1, wherein the logic is to:
distribute the decoded data to the plurality of processing elements based on individual rates of consumption of the plurality of processing elements.

3. The computing system of claim 1, wherein:
the decode buffer includes a plurality of datastores that include a plurality of buffers; and
wherein the logic is to store the compressed data in the plurality of datastores based on X values and Y values associated with the tensors.

4. The computing system of claim 1, wherein:
the decode buffer includes a plurality of datastores that include a plurality of buffers, wherein the plurality of datastores includes a first group of datastores and a second group of datastores;
the logic includes a plurality of writing portions that are implemented at least partly in one or more of configurable or fixed-functionality hardware; and
the logic is to control a first writing portion of the plurality of writing portions to write to the first group of datastores, wherein the second group of datastores is inaccessible to the first writing portion.

5. The computing system of claim 1, wherein:
the decode buffer includes a plurality of buffers;
the logic includes a writing portion that is implemented at least partly in one or more of configurable or fixed-functionality hardware; and
wherein the logic is to control the writing portion to access any of the plurality of buffers to execute write operations based on X and Y values associated with the plurality of tensors.

6. The computing system of claim 1, wherein the logic is to:
align a first portion of the compressed data with a first portion of the sparsity bitmap; and
provide the first portion of the compressed data with the first portion of the sparsity bitmap to the plurality of processing elements to bypass a provision of unaligned portions of the compressed data and the sparsity bitmap to the processing elements.

7. A semiconductor apparatus comprising:
one or more substrates; and
logic coupled to the one or more substrates, wherein the logic is implemented in one or more of configurable or fixed-functionality hardware, the logic to:
prefetch compressed data and a sparsity bitmap from a memory to store the compressed data in a decode buffer, wherein the compressed data is associated with a plurality of tensors, wherein the compressed data is to be in a compressed format;
align the compressed data with the sparsity bitmap to generate decoded data; and
provide the decoded data to a plurality of processing elements.

8. The apparatus of claim 7, wherein the logic is to:
distribute the decoded data to the processing elements based on individual rates of consumption of the processing elements.

9. The apparatus of claim 7, wherein:
the decode buffer includes a plurality of datastores that include a plurality of buffers; and
the logic is to store the compressed data in the plurality of datastores based on X values and Y values associated with the tensors.

10. The apparatus of claim 7, wherein:
the decode buffer includes a plurality of datastores that include a plurality of buffers, wherein the plurality of datastores includes a first group of datastores and a second group of datastores;
the logic includes a plurality of writing portions that are implemented at least partly in one or more of configurable or fixed-functionality hardware; and
the logic is to control a first writing portion of the plurality of writing portions to write to the first group of datastores, wherein the second group of datastores is inaccessible to the first writing portion.

11. The apparatus of claim 7, wherein:
the decode buffer includes a plurality of buffers;
the logic includes a writing portion that is implemented at least partly in one or more of configurable or fixed-functionality hardware; and
wherein the logic is to is to control the writing portion to access any of the plurality of buffers to execute write operations based on X and Y values associated with the plurality of tensors.

12. The apparatus of claim 7, wherein the logic is to:
align a first portion of the compressed data with a first portion of the sparsity bitmap; and
provide the first portion of the compressed data with the first portion of the sparsity bitmap to the plurality of processing elements to bypass a provision of unaligned portions of the compressed data and the sparsity bitmap to the processing elements.

13. The apparatus of claim 7, wherein the logic includes transistor channel regions that are positioned within the one or more substrates.

14. At least one computer readable storage medium comprising a set of executable program instructions, which when executed by a computing system, cause the computing system to:
prefetch compressed data and a sparsity bitmap from a memory to store the compressed data in a decode buffer, wherein the compressed data is associated with a plurality of tensors, wherein the data is to be in a compressed format;
align the compressed data with the sparsity bitmap to generate decoded data; and
provide the decoded data to a plurality of processing elements.

15. The at least one computer readable storage medium of claim 14, wherein the executable program instructions, when executed, further cause the computing system to:
distribute the decoded data to the processing elements based on individual rates of consumption of the processing elements.

16. The at least one computer readable storage medium of claim 14, wherein:
the decode buffer includes a plurality of datastores that include a plurality of buffers; and
the executable program instructions, when executed, further cause the computing system to store the compressed data in the plurality of datastores based on X values and Y values associated with the tensors.

17. The at least one computer readable storage medium of claim 14, wherein the executable program instructions, when executed, further cause the computing system to:
control a first writing portion of a plurality of writing portions to write to a first group of datastores of the decode buffer, wherein a second group of datastores of the decode buffer is inaccessible to the first writing portion, wherein the plurality of writing portions are implemented at least partly in one or more of configurable or fixed-functionality hardware.

18. The at least one computer readable storage medium of claim 14,
wherein the decode buffer includes a plurality of buffers; and
wherein the executable program instructions, when executed, further cause the computing system to control a writing portion, that is implemented at least partly in one or more of configurable or fixed-functionality hardware, to access any of the plurality of buffers to execute write operations based on X and Y values associated with the plurality of tensors.

19. The at least one computer readable storage medium of claim 14, wherein the executable program instructions, when executed, further cause the computing system to:
align a first portion of the compressed data with a first portion of the sparsity bitmap; and
provide the first portion of the compressed data with the first portion of the sparsity bitmap to the plurality of processing elements to bypass a provision of unaligned portions of the compressed data and the sparsity bitmap to the processing elements.

20. A method comprising:
prefetching compressed data and a sparsity bitmap from a memory to store the compressed data in a decode buffer, wherein the compressed data is associated with a plurality of tensors, wherein the compressed data is in a compressed format;
aligning the compressed data with the sparsity bitmap to generate decoded data; and
providing the decoded data to a plurality of processing elements.

21. The method of claim 20, further comprising:
distributing the decoded data to the processing elements based on individual rates of consumption of the processing elements.

22. The method of claim 20, wherein:
the decode buffer includes a plurality of datastores that include a plurality of buffers; and
the method further includes storing the compressed data in the plurality of datastores based on X values and Y values associated with the tensors.

23. The method of claim 20, further comprising:
controlling a first writing portion of a plurality of writing portions to write to a first group of datastores of the decode buffer, wherein a second group of datastores of the decode buffer is inaccessible to the first writing portion, wherein the plurality of writing portions is implemented at least partly in one or more of configurable or fixed-functionality hardware.

24. The method of claim 20,
wherein the decode buffer includes a plurality of buffers; and
wherein the method further comprises controlling a plurality of writing portions, that are implemented at least partly in one or more of configurable or fixed-functionality hardware, to access any of the plurality of buffers to execute write operations based on X and Y values associated with the plurality of tensors.

25. The method of claim 20, the method further comprises:
aligning a first portion of the compressed data with a first portion of the sparsity bitmap; and
providing the first portion of the compressed data with the first portion of the sparsity bitmap to the plurality of processing elements to bypass a provision of unaligned portions of the compressed data and the sparsity bitmap to the processing elements.

* * * * *